United States Patent [19]
Suzuki et al.

[11] Patent Number: 6,078,748
[45] Date of Patent: Jun. 20, 2000

[54] LENS-FITTED FILM UNIT

[75] Inventors: Kijirou Suzuki; Kei Kaneiwa; Hiroshi Yamaguchi; Kazuhisa Aratame; Hiromi Nakanishi; Masami Fujita, all of Hino; Hideaki Ono; Mamoru Kawano, both of Tokyo; Shuri Mizoguchi; Tetsufumi Takaba, both of Hino, all of Japan

[73] Assignee: Konica Corporation, Japan

[21] Appl. No.: 08/948,995

[22] Filed: Oct. 10, 1997

[30] Foreign Application Priority Data

| Oct. 14, 1996 | [JP] | Japan | 8-270548 |
| Jan. 30, 1997 | [JP] | Japan | 9-016050 |
| Feb. 14, 1997 | [JP] | Japan | 9-030381 |
| Feb. 25, 1997 | [JP] | Japan | 9-040332 |
| Feb. 25, 1997 | [JP] | Japan | 9-040335 |

[51] Int. Cl.$^7$ .............................. G03B 17/02; G03B 15/03
[52] U.S. Cl. ................................. 396/6; 396/176; 396/542
[58] Field of Search .............................. 396/6, 176, 535, 396/542; 361/813, 823, 824

[56] References Cited

U.S. PATENT DOCUMENTS

| 4,600,971 | 7/1986 | Rose et al. | 361/421 |
| 4,611,262 | 9/1986 | Galloway et al. | 361/421 |
| 5,446,626 | 8/1995 | Dittmann et al. | 361/813 |
| 5,541,687 | 7/1996 | Pearson | 396/542 |
| 5,659,803 | 8/1997 | Takegi et al. | 396/6 |
| 5,752,119 | 5/1998 | Miyamoto et al. | 396/535 |
| 5,784,658 | 7/1998 | Hata et al. | 396/311 |

*Primary Examiner*—Eddie C. Lee
*Attorney, Agent, or Firm*—Jordan B. Bierman; Bierman, Muserlian and Lucas

[57] ABSTRACT

A strobe circuit for use in a lens-fitted film unit is composed of a metallic thin plate punched in a circuit pattern; and insulating plate materials covering both obverse and reverse surfaces of the metallinc thin plate; wherein a part of the metallic thin plate is used as a component of the strobe circuit.

4 Claims, 41 Drawing Sheets

FIG. 1
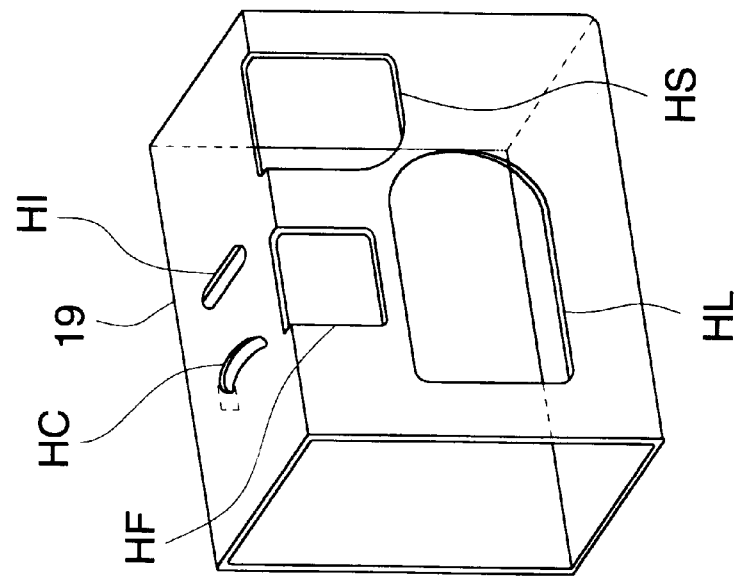
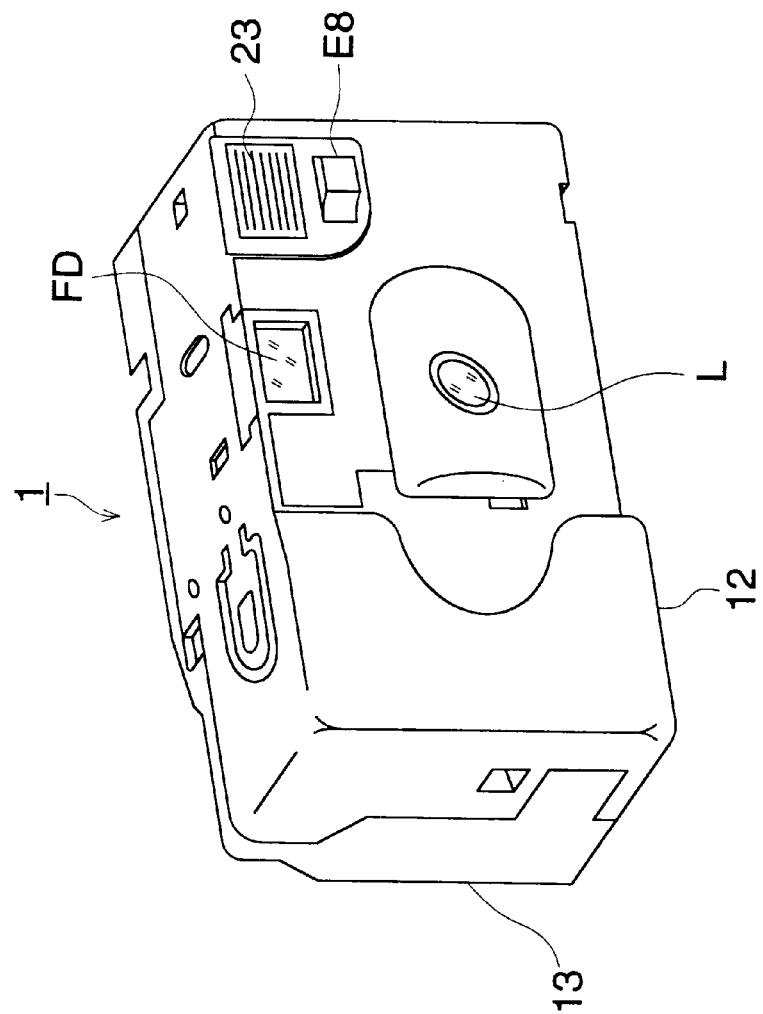

FIG. 15 ( a )
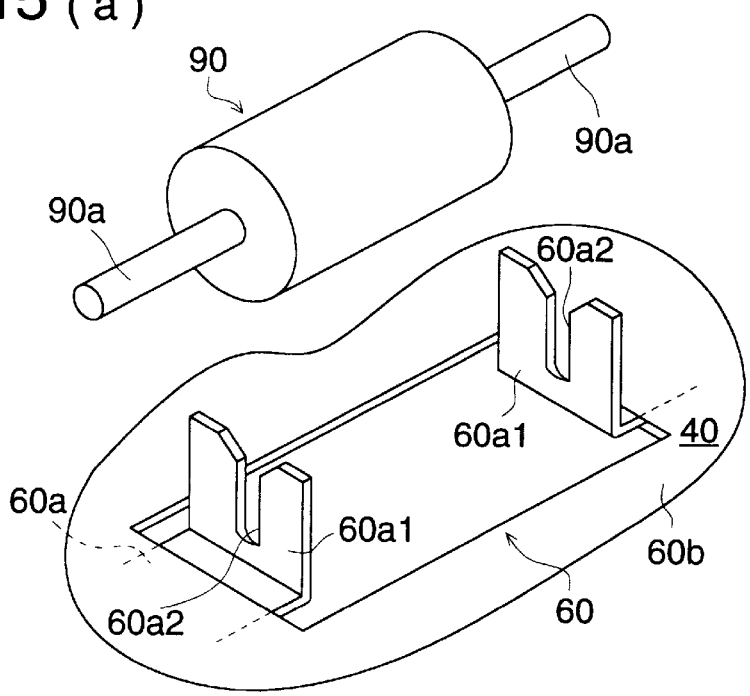
FIG. 15 ( b )
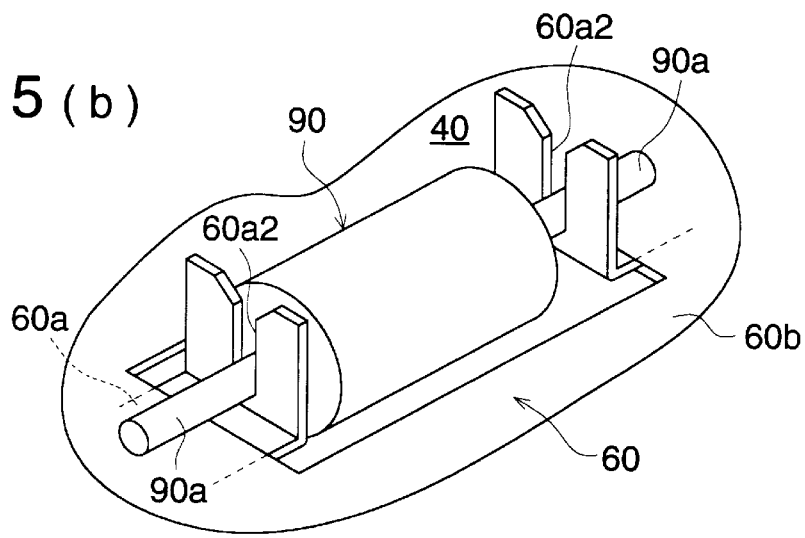
FIG. 15 ( c )
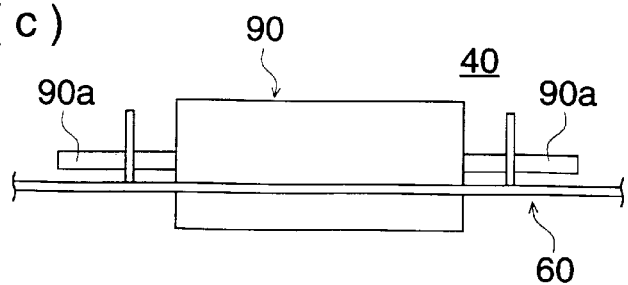

FIG. 40
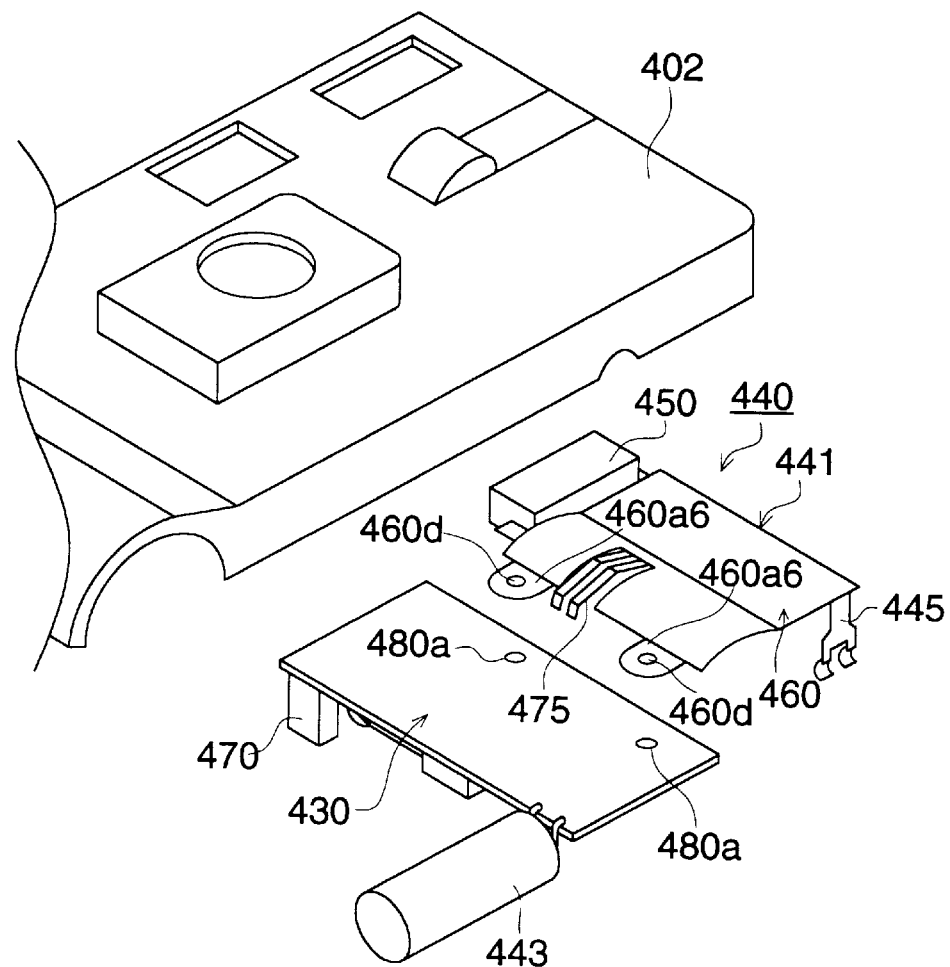
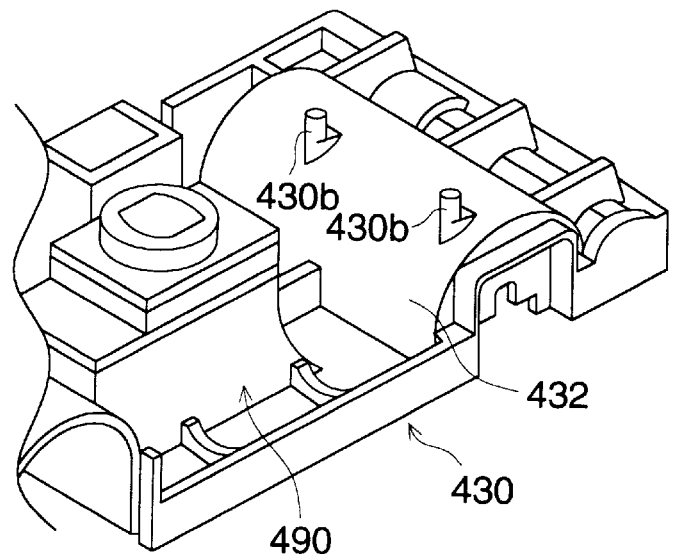

LENS-FITTED FILM UNIT

BACKGROUND OF THE INVENTION

The present invention relates to a lens-fitted film unit, and in particular, to a lens-fitted film unit equipped with a strobe.

The lens-fitted film unit is required, from the viewpoint of its nature, to be reduced in terms of its cost to the utmost and whereby to be offered to users at a low price. Users also demand that the lens-fitted film unit is thin in thickness and is small in size as far as possible.

However, especially in the case of a lens-fitted film unit equipped with a strobe, its strobe circuit board employs a circuit board which is relatively thick as one for a lens-fitted film unit, and various expensive electronic parts are attached and soldered on the circuit board to form a strobe unit.

Therefore, in a lens-fitted film unit equipped with a strobe, a strobe unit occupies a greater part of the cost and space of the lens-fitted film unit.

In the lens-fitted film unit equipped with a strobe, cost reduction for a strobe unit occupying a greater part of the cost of the film unit and thinning and down-sizing of the strobe unit occupying a greater part of the space of the film unit have a great influence on cost reduction and thinning of the lens-fitted film unit, and an effect derived from achievement of them is also great.

Therefore, cost reduction, thinning and down-sizing of the strobe unit hold the important key to the offering of an inexpensive, thin and small-sized lens-fitted film unit to users.

The invention has been achieved to solve the problems stated above. Namely, its object is to provide an inexpensive lens-fitted film unit that is thin in thickness and small in size to users, by reducing the cost of a strobe unit and by making the strobe unit to be thin.

SUMMARY OF THE INVENTION

The objects of the invention can be attained by the following structures.

1. A lens-fitted film unit having a strobe unit that enables the lens-fitted film unit to operate for photographing with a strobe by causing its xenon discharge tube to emit light, wherein a circuit board of the strobe unit is made of a laminated board composed of a metallic thin plate which is punched in a form of a circuit pattern and insulating thin plates which are glued and fixed in a manner to cover the obverse side and the reverse side of the metallic thin plate.

A circuit board of the strobe circuit in a lens-fitted film unit equipped with a strobe itself is required to be housed in an irregular space in the film unit so that the film unit may be made thin totally.

In the case of a conventional board of a flat plate type, therefore, a flash board itself is required to be deformed because the film unit can not be thinned totally.

As a board which can be deformed, there has been available a flexible board.

However, in the case of a lens-fitted film unit equipped with a strobe, there have been needed a large-sized capacitor and connection with an AA battery, or an AAA battery of, and connection of those elements and batteries with a flexible board has not been easy due to the low stiffness of the flexible board itself.

In the case of a laminated board having the above-mentioned structure of the present invention wherein an obverse side and a reverse side of a metallic thin plate punched in a form of a circuit pattern are covered with insulating materials, on the other hand, connection with a deformable and large-sized capacitor and with a battery can easily be attained, and in particular, such board is optimum as a flash board in a lens-fitted film unit equipped with a strobe.

2. On a part of a metallic thin plate of the laminated board mentioned above, a trigger switch for strobe luminescence composed of a fixed contact blade and a movable contact blade is formed solidly, and the fixed contact blade and the movable contact blade are formed by bending a part of the metallic thin plate, so that the width of the fixed contact blade is made to be greater than that of the movable contact blade. Whereby, the trigger switch for strobe luminescence can be integrated with the laminated board simply and surely, resulting in a low cost. In addition, the fixed contact blade of the trigger switch for strobe luminescence can be made to have prescribed strength so that its positional slip caused by switching operations of the movable contact blade may not occur and constant shutter speed may therefore be obtained.

3. On a part of a metallic thin plate of the laminated board mentioned above, a trigger switch for strobe luminescence composed of a fixed contact blade and a movable contact blade is formed solidly, and the fixed contact blade is formed in a way that an opening is formed on a part of the insulating thin plate and a part of the metallic thin plate is exposed, while the movable contact blade is formed by bending a part of the metallic thin plate, thus the trigger switch for strobe luminescence can be integrated with the laminated board simply and surely, resulting in a low cost. In addition, the fixed contact blade of the trigger switch for strobe luminescence can be formed easily by making a part of the metallic thin plate to be exposed, and it can be made to have prescribed strength so that its positional slip caused by switching operations of the movable contact blade may not occur and constant shutter speed may therefore be obtained.

4. On a part of a metallic thin plate of the laminated board mentioned above, a trigger switch composed of a fixed contact blade and a movable contact blade is formed solidly, and the fixed contact blade is formed in a way that an opening is formed on a part of the insulating thin plate and a part of the metallic thin plate is exposed, while the movable contact blade is formed by bending a part of the metallic thin plate and by fixing it with solder at the exposure portion where an opening is formed on a part of the insulating thin plate, thus the switch can be integrated with the laminated board simply and surely, resulting in a low cost. In addition, the movable contact blade of the switch is firmly fixed on a part of the metallic thin plate to have prescribed strength.

5. On a part of the metallic thin plate of the laminated board, there is formed an opening so that plural portions on a part of the metallic thin plate may be exposed, and print resistors are electrically connected with plural exposure portions on the metallic thin plate, thus, print resistors are arranged on the laminated board to be integrated therewith, resulting in easy securing of a space for arrangement and degree of freedom in position for arrangement.

6. A cross-shaped cut line hole or a U-shaped cut line is formed on the laminated board, and a lead wire of an electronic part is forced in the cut line to be fixed for continuity, whereby, the lead wire of an electronic part can be fixed on a thin laminated board for continuity, without being soldered, and that, electronic parts can easily be removed, resulting in a simple maintenance of circuits.

7. On the laminated board, there is formed a (–)-shaped hole or a cross-shaped hole, and a battery contact blade is forced in this hole to be fixed for continuity, whereby, a battery contact blade can be fixed for continuity on a thin laminated board without being soldered, and that, a battery contact blade can easily be removed, resulting in a simple maintenance of circuits.

8. A battery contact blade is fixed in a camera main body, and when mounting the laminated board on a camera main body, the battery contact blade is forced in a (−)-shaped hole or a cross-shaped hole provided on the laminated board to be fixed for continuity, thereby the battery contact blade is fixed on a camera main body to improve positional accuracy, resulting in stable electrical connection with a battery.

9. A trigger switch is attached to a camera main body, and a terminal of the trigger switch is forced in a (−)-shaped hole or a cross-shaped hole provided on the laminated board to be fixed for continuity when the laminated board is mounted on the camera main body, thereby the trigger switch is fixed on the camera main body, resulting in an improvement of positional accuracy, and a position with regard to the shutter mechanism is made to be constant, resulting in stable shutter speed.

10. A part of the laminated board is cut and lifted, and a cut-out whose width is smaller than a diameter of a lead wire of an electronic part is formed on the lifted portion, and a lead wire of an electronic part is forced in the cut-out to be fixed for continuity. By cutting and lifting a part of a laminated board and by inserting a lead wire of an electronic part into a cut-out formed on the lifted portion for continuity fixation, the actual mounting according to the present invention can be completed only through the step for inserting a lead wire of an electronic part into a cut-out on the laminated board, contrary to the three steps to make a hole on the laminated board, to thread a lead wire of an electronic part, to bend the lead wire, and to solder the lead wire on the laminated board, the mounting according to the present invention reduces man-hour for assembly. If the electronic part is fixed, it is possible to replace the electronic part easily, when it is found to be damaged in the course of assembly of a strobe unit or in the course of inspection for the reuse. Further, the lead wire may further be soldered after being inserted for the portion where a heavy current flows or high voltage is impressed.

11. By bending an edge portion of the laminated board, forming a cut-out on this edge portion, and by fixing a terminal of a strobe capacitor in the cut-out for continuity through soldering, the strobe capacitor can easily be fixed on the laminated board for continuity without being bent at its terminal, and the number of steps is reduced by quantity equivalent to the step of bending the terminal of the strobe capacitor, which results in a low cost. Further, the strobe capacitor can be fixed at the base of the terminal thereof on the board, and inclination of the strobe capacitor caused by the curved terminal can also be improved.

12. A neon tube that tells completion of charging on a strobe is arranged on the laminated board. The laminated board is one wherein both sides of a metallic thin plate punched to form a circuit pattern are covered and fixed by insulating thin plates, and it is thinner than a paper phenol board and is capable of being bent. Making use of this advantage, it is possible to raise a degree of freedom for the position for arranging a neon tube, namely, the position of a strobe charging confirmation window, by bending the board.

13. The neon tube is fixed on the laminated board in a way that a lead wire of the neon tube is inserted fully to its base portion in an attachment hole provided on the laminated board. Since the base portion of the lead wire of the neon tube is fixed on the board, falling or inclination of the neon tube is less than that of the conventional one.

14. A part of the edge portion of the laminated board is bent at right angle. The laminated board is one wherein both sides of a metallic thin plate punched to form a circuit pattern are covered and fixed by insulating thin plates, and it has problems that its stiffness is low and its flatness is poor, due to its structure. However, it is possible to improve stiffness and flatness of the laminated board by bending a part of its edge portion at right angle.

15. When a part of a metallic thin plate of a laminated board is subjected to drawing processing, the strength of the laminated board can be improved.

16. By forming a cut-out recess on the edge portion of the laminated board by cutting off a portion of the metallic thin plate where high voltage is impressed of the edge portion of the laminated board, it is possible to make the portion of the metallic thin plate where high voltage is impressed to be a cut-out recess which is untouchable for an operator and thereby to prevent that an operator is struck by electricity when inspecting the laminated board in its assembled state.

17. By extending a part of the insulating thin plate at the edge portion of the laminated board, and thereby by covering an end of a portion of the metallic thin plate where high voltage is impressed with the aforesaid part of the insulating thin plate, it is possible to make the part of the metallic thin plate of the laminated board where high voltage is impressed to be of a structure that is untouchable for an operator by covering it with a part of the insulating thin plate, and thereby to prevent that an operator is struck by electricity when inspecting the laminated board in its assembled state.

18. When a positioning reference hole for assembly is formed on a portion of the metallic thin plate of the laminated board, the strength of the positioning reference hole for assembly of the laminated board can be improved, eliminating that the hole is deformed easily or damaged in the course of assembly. In addition, no positional slip of the laminated board is caused even in its assembled state, preventing malfunction of a strobe.

19. When there is provided a hole, a cut line, perforations, or an engagement portion with a form of combination thereof, on at least one location of an area formed by the insulating thin plate alone of the laminated board, and when this engagement portion is engaged with a protrusion provided on a camera main body, it is possible to inspect a strobe unit by mounting it on or dismounting it from the camera main body simply, the laminated board can surely be supported on the camera through friction without the use of an additional and special member, and it is possible to absorb the shock and to prevent damage of electronic parts both are caused when a camera is dropped.

20. When the area formed by the insulating thin plate alone on the laminated board is made to be capable of being provided with holes so that information may be recorded by the number of holes, the number of uses of the camera can easily be learned and erroneous reuse of the strobe whose efficiency is lowered can be prevented.

21. In a lens-fitted film unit having therein a strobe unit and is capable of photographing through luminescence of a xenon discharge tube equipped on the strobe unit, a circuit board of the strobe unit is a solid board in which a board made of paper phenol and a laminated board in which both sides of a metallic thin plate punched to form a circuit pattern are covered and fixed by insulating thin plates are connected. By making the paper phenol board and the laminated board to be united solidly, it is possible to make a clearance between a film chamber and a front cover to be small by locating a thin laminated board in front of the film chamber and to make the lens-fitted film unit to be thin.

22. On the paper phenol board, there are provided electronic parts and a trigger switch, and on the laminated board, there are solidly formed metal sheet parts such as battery contact blades, xenon terminals and a main switch. Since the laminated board makes actual mounting of electronic parts and a trigger switch by a machine and collective soldering in a soldering tank to be difficult, electronic parts and a trigger switch are arranged on the paper phenol board, and metal sheet parts such as battery contact blades, xenon tube terminals and a main switch are solidly formed on the laminated board, whereby man-hour and the number of parts can be reduced and a cost reduction can be achieved.

23. The paper phenol board is located between a lens barrel having therein a photographing lens and shutter blades and a film chamber. By locating the paper phenol board at a portion between a lens barrel and a film chamber having relatively a space, a lens-fitted film unit can be made thin.

24. In a lens-fitted film unit having therein a strobe unit wherein a part of a board is a laminated board and a remaining portion thereof is a paper phenol board, a part of the laminated board is inserted in a hole made on the paper phenol board to be soldered so that a solid board may be formed. When a part of the laminated board is inserted in a hole on the paper phenol board and is soldered, disagreement in terms of position between both boards is eliminated, and solder peeling off caused by external force and peeling off of a pattern of the paper phenol board are hard to occur. In addition, when the laminated board is forced in a hole on the paper phenol board, it does not happen that the laminated board comes off the hole before soldering, resulting in easy operation.

25. In a lens-fitted film unit wherein a strobe unit is provided, and a circuit board of the strobe unit is a solid board in which a board made of paper phenol and a laminated board in which both sides of a metallic thin plate punched to form a circuit pattern are covered and fixed by insulating thin plates are connected, when connection holes are formed on both the paper phenol board and the laminated board, and when a member for fixing a front cover on a camera main body is inserted to be fixed for continuity by making the connection hole of the paper phenol board and that of the laminated board to agree, it is possible to connect the paper phenol board with the laminated board for simple and sure fixing for continuity by fixing the front cover on the camera main body, with neither steps for connecting both boards and for soldering them nor additional and special connecting member.

BRIEF DESCRIPTION OF THE DRAWINGS

FIG. 1 is a perspective view of the front side of a lens-fitted film unit.

Figure 4:
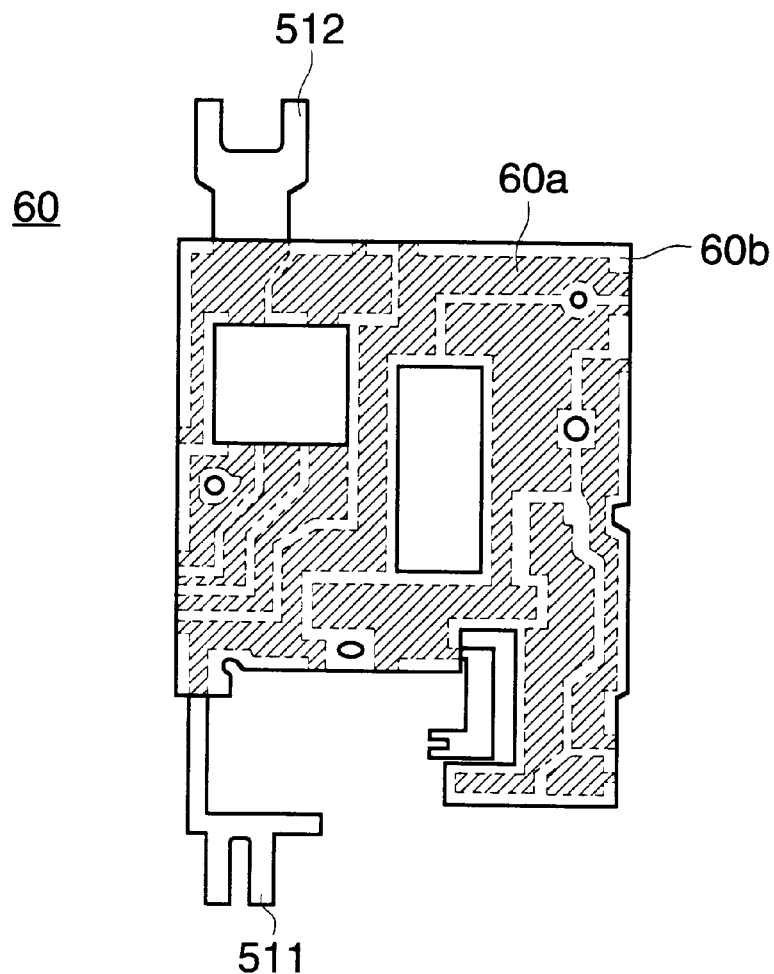
Figure 4:
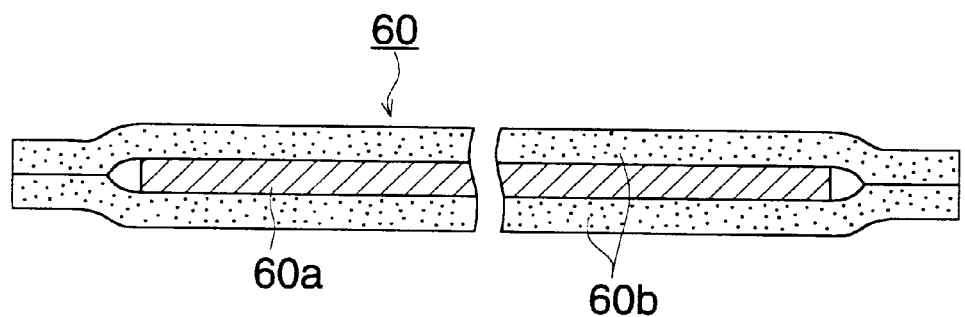

Each of FIGS. 4(*a*) and 4(*b*) is a diagram illustrating a basic structure of a circuit board of a strobe unit.

Figures 5A, 5B:
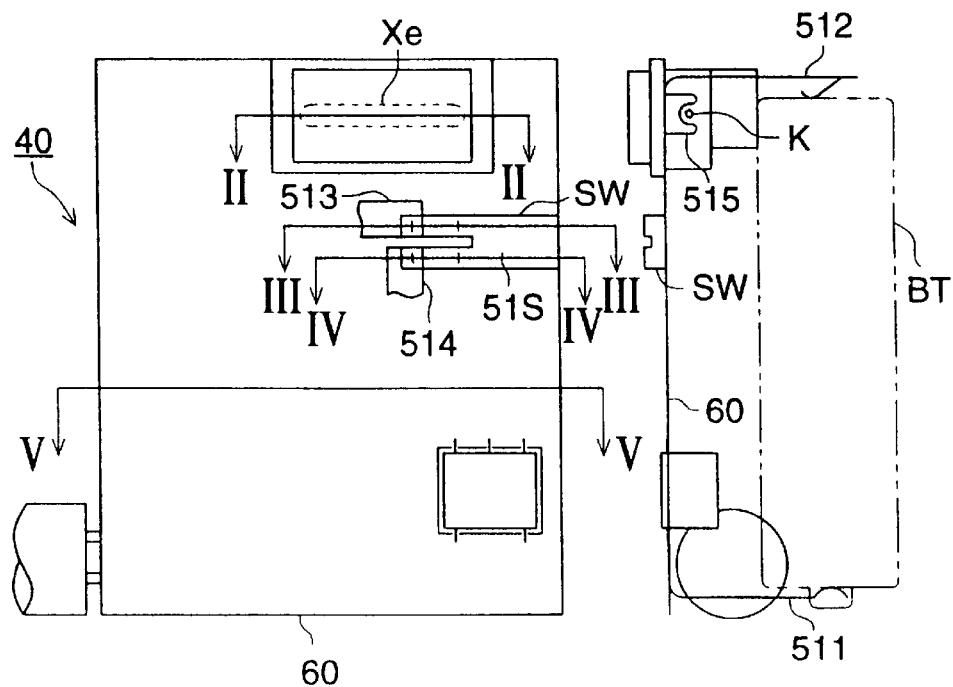
Figure 5C:
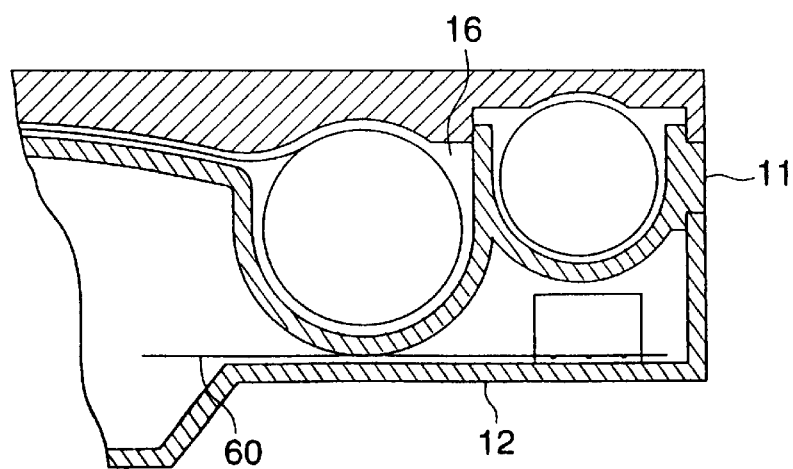

FIGS. 5(*a*), 5(*b*) and 5(*c*) respectively represent a front view and a right side view of the strobe unit and a sectional view illustrating how the strobe unit is incorporated in the lens-fitted film unit.

Figure 6:
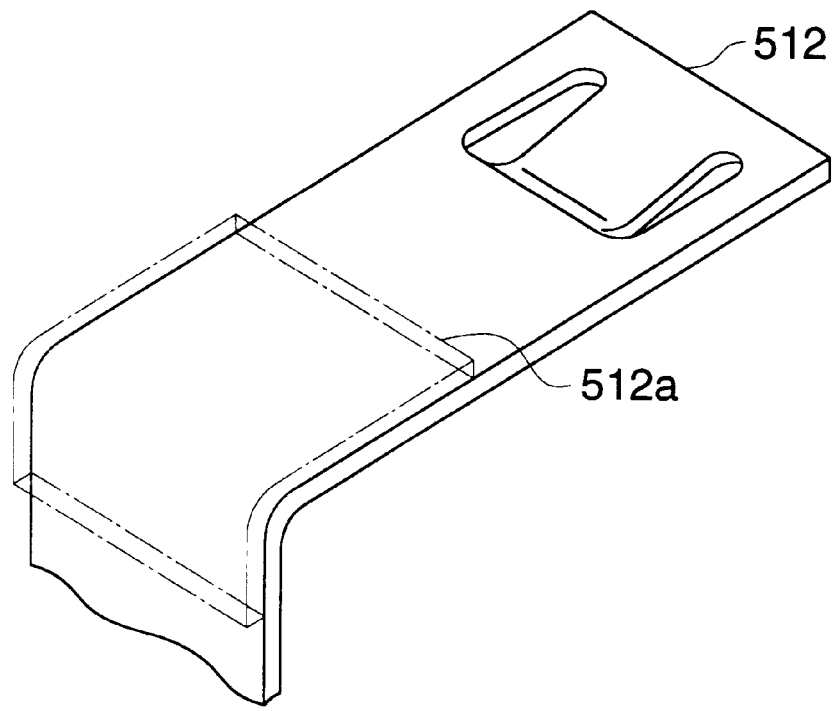
Figure 6:
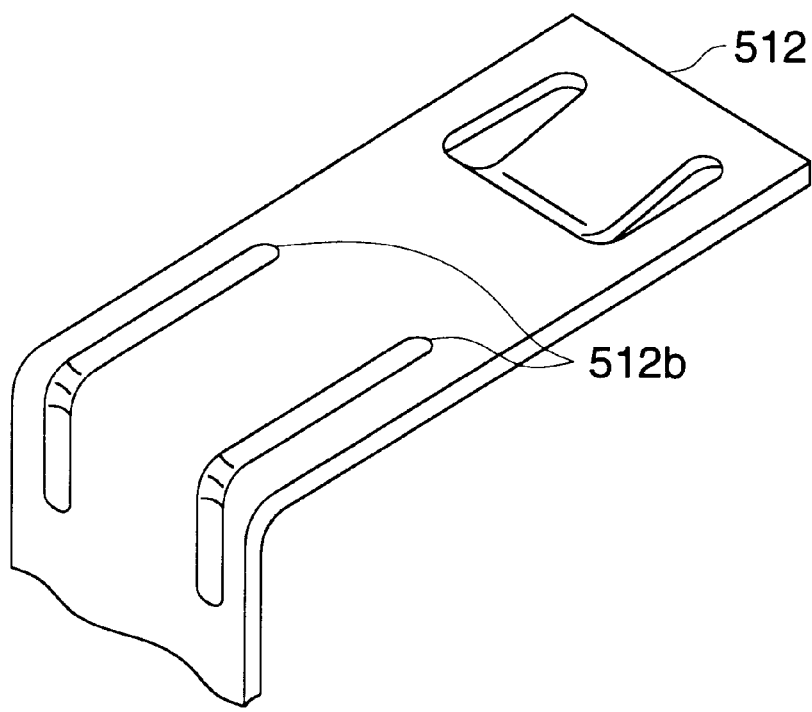

Each of FIGS. 6(*a*) and 6(*b*) is a diagram illustrating a battery contact blade.

Figure 7:
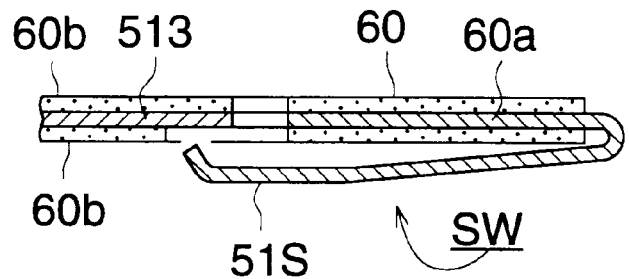
Figure 7:
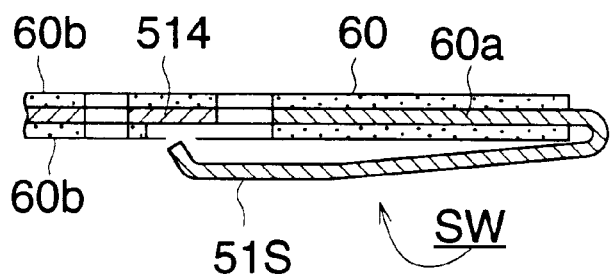
Figure 7:
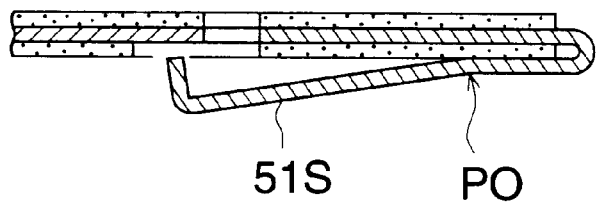

Each of FIGS. 7(*a*), 7(*b*) and 7(*c*) is a diagram illustrating a strobe switch.

Figure 8:
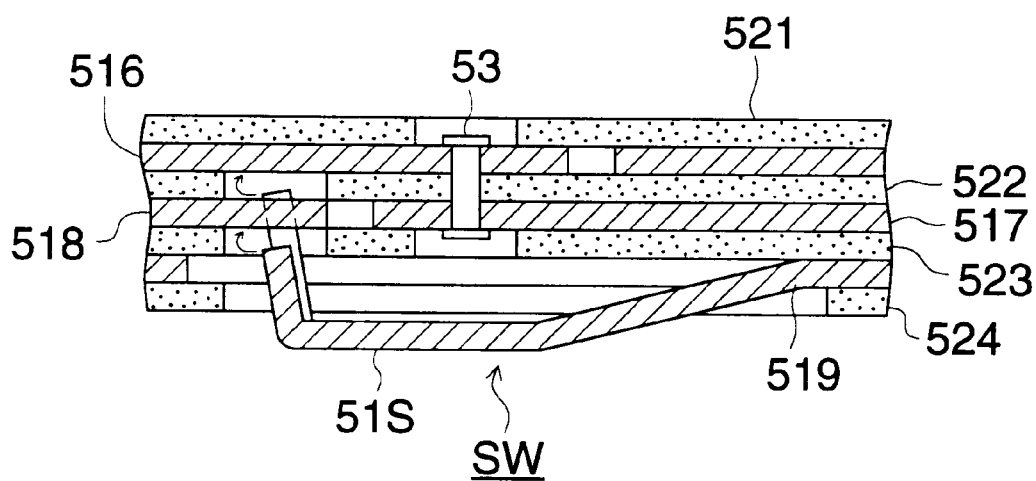

FIG. 8 is a diagram illustrating the structure of another strobe switch.

Figure 9:
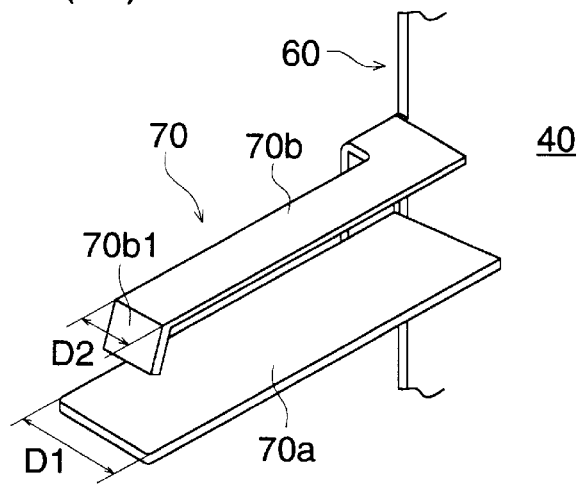
Figure 9:
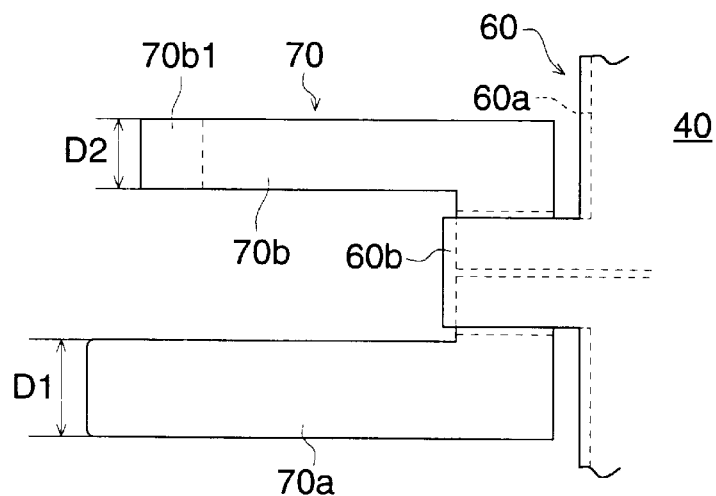
Figure 9:
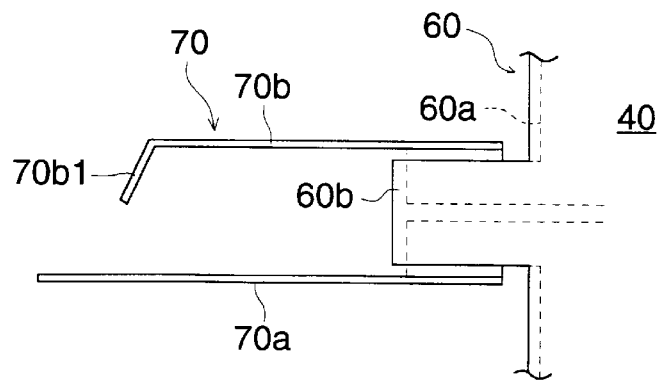

Each of FIGS. 9(*a*), 9(*b*) and 9(*c*) is a diagram showing s strobe unit on which a trigger switch for strobe luminescence is actually mounted.

Figure 10:
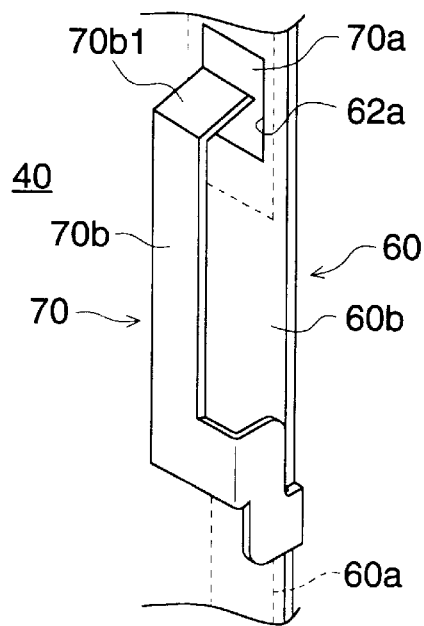
Figure 10:
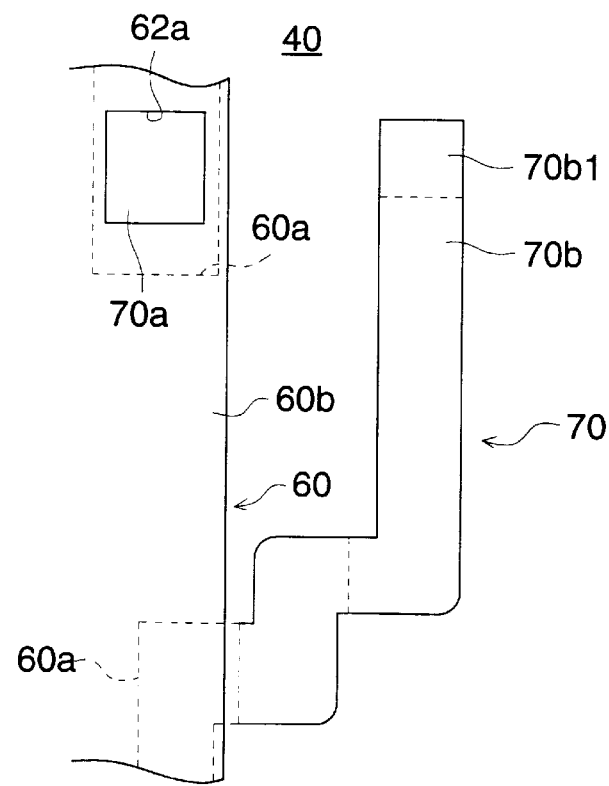

Each of FIGS. 10(*a*) and 10(*b*) is a diagram showing another embodiment of s strobe unit on which a trigger switch for strobe luminescence is actually mounted.

Figure 11:
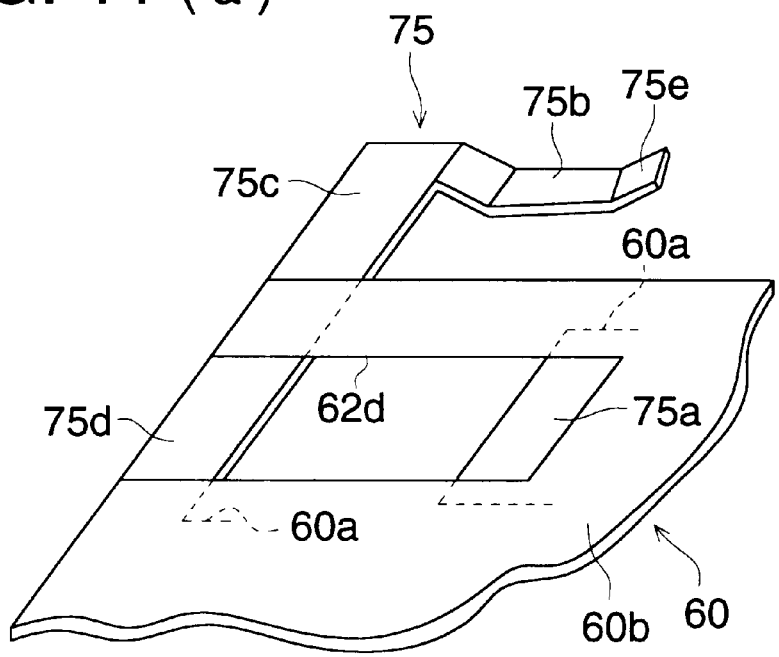
Figure 11:
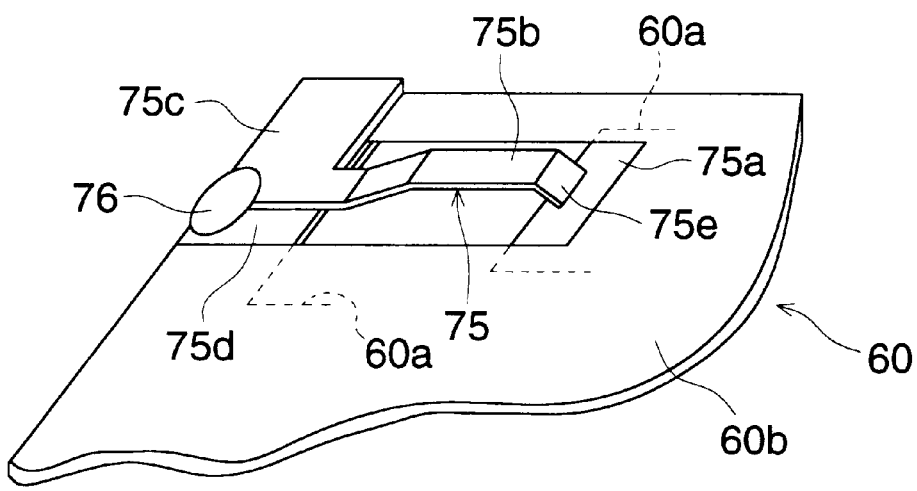

Each of FIGS. 11(*a*) and 11(*b*) is a diagram showing s strobe unit on

Figure 12:
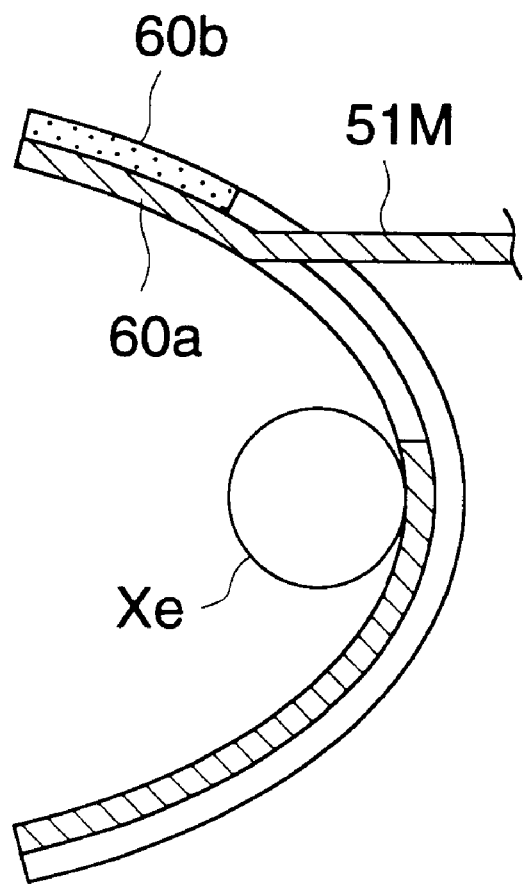

FIG. 12 is a diagram illustrating a reflector of a xenon discharge tube.

Figure 13:
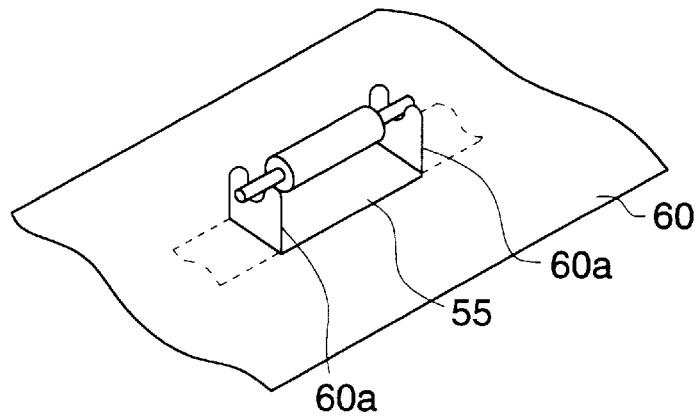
Figure 13:
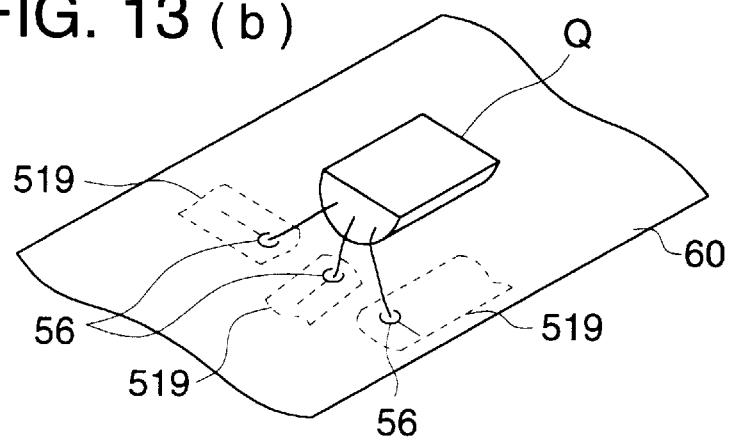
Figure 13:
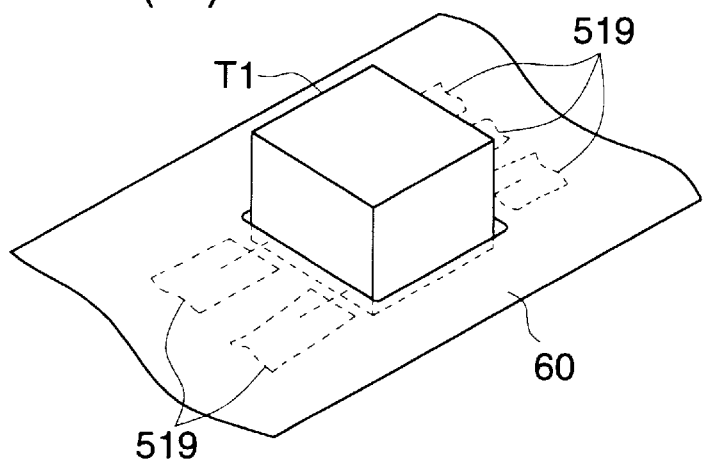

Each of FIGS. 13(*a*), 13(*b*) and 13(*c*) is a diagram illustrating how strobe circuit parts are attached on a circuit board.

Figure 14:
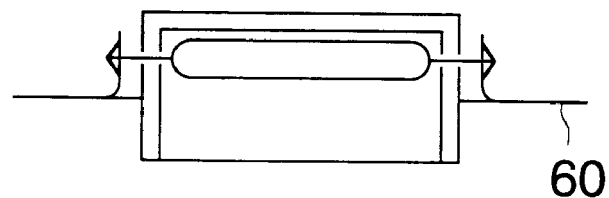
Figure 14:
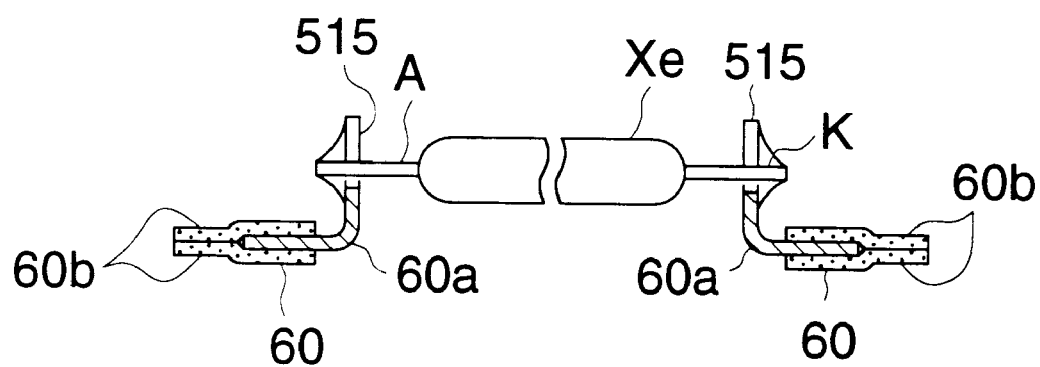

Each of FIGS. 14(*a*) and 14(*b*) is a diagram illustrating a terminal contact blade of a xenon discharge tube.

Each of FIGS. 15(*a*), 15(*b*) and 15(*c*) is a diagram illustrating how a lead wire is fixed on a metallic thin plate exposed from a laminated board.

Figure 16:
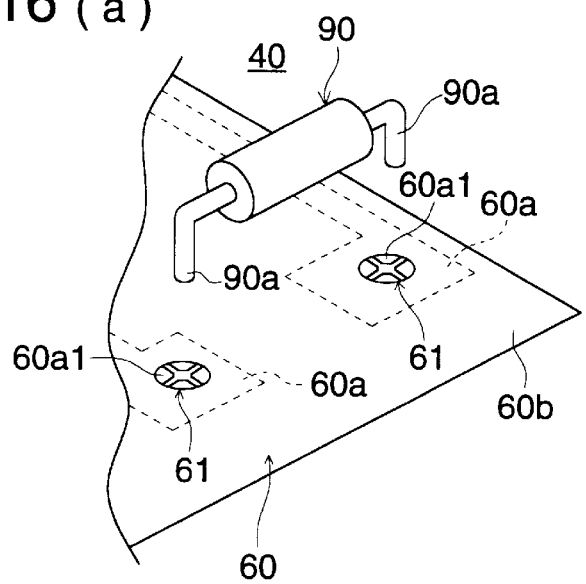
Figure 16:
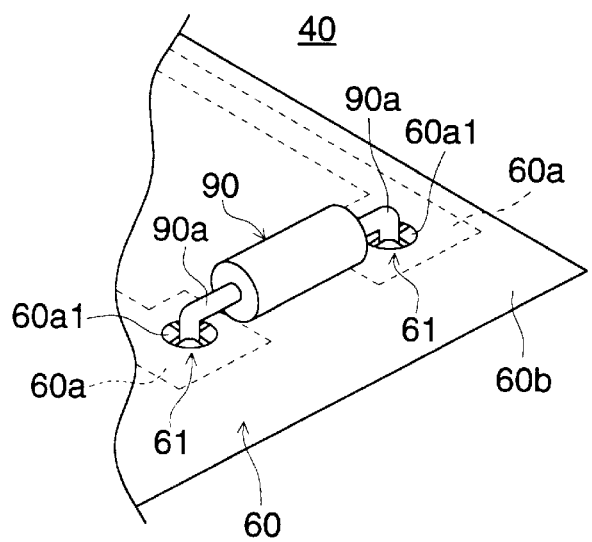
Figure 16:
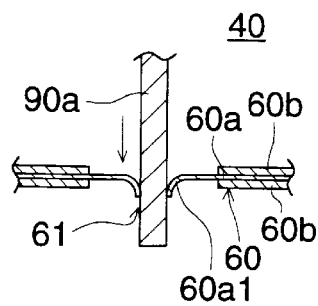

Each of FIGS. 16(*a*), 16(*b*) and 16(*c*) is a diagram illustrating how to form a cross-shaped hole on a laminated board and how to fix a lead wire.

Figure 17:
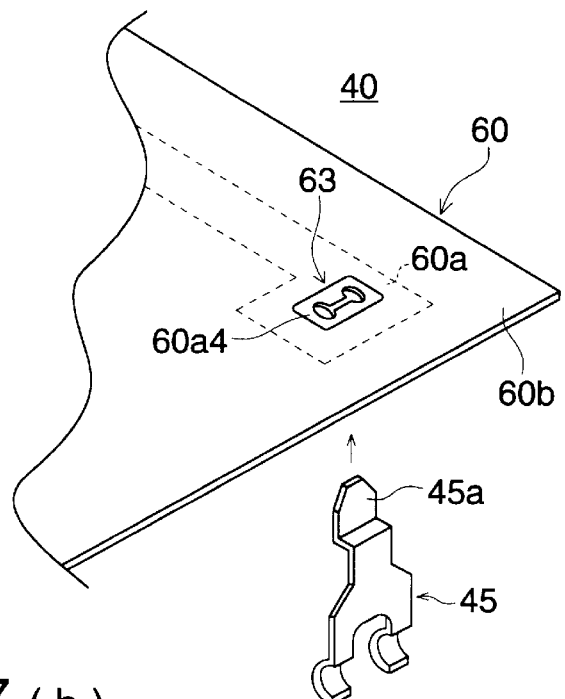
Figure 17:
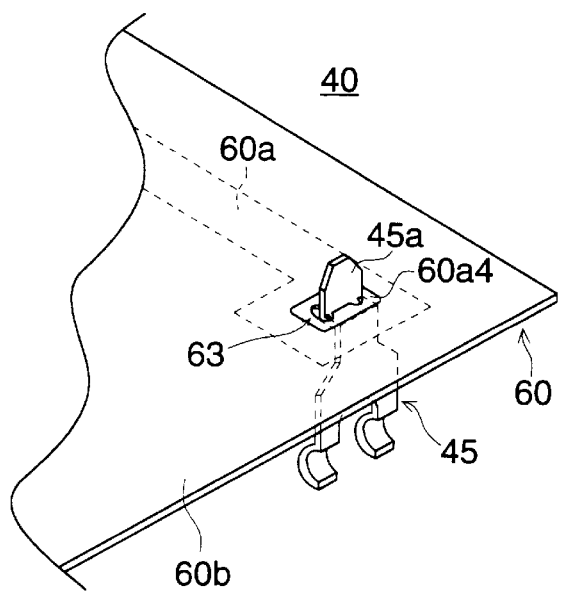
Figure 17:
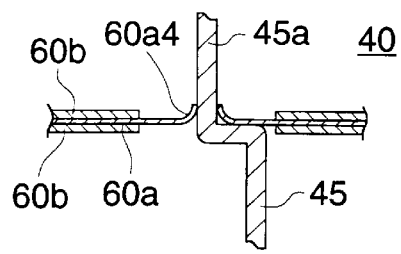

Each of FIGS. 17(*a*), 17(*b*) and 17(*c*) is a diagram illustrating how to form a (−)-shaped hole on a laminated board and how to fix a blade.

Figure 18:
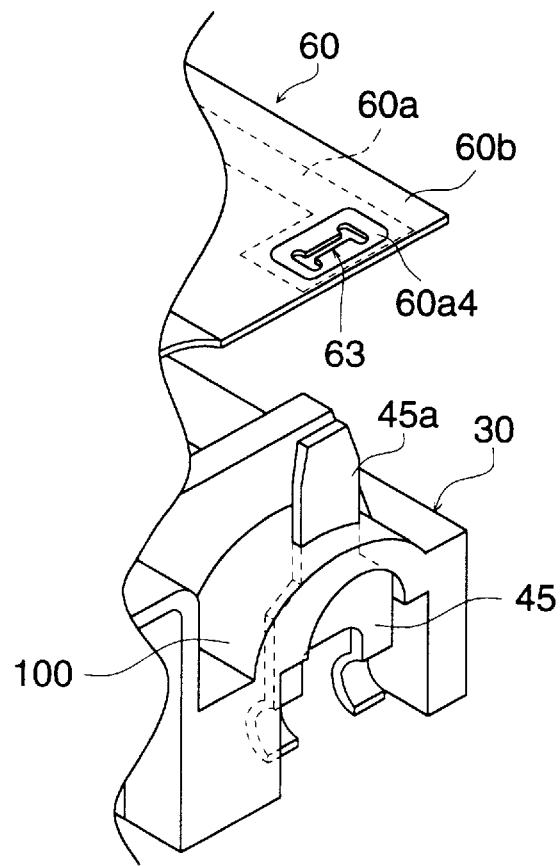
Figure 18:
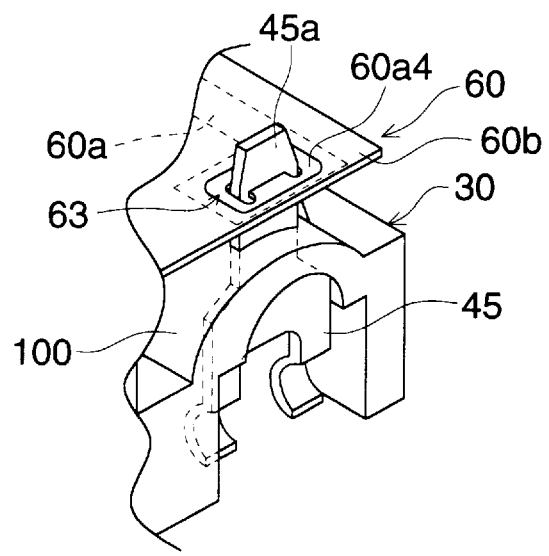

Each of FIGS. 18(*a*) and 18(*b*) is a diagram illustrating how to form a (−)-shaped hole on a laminated board and how to fix a blade.

Figure 19:
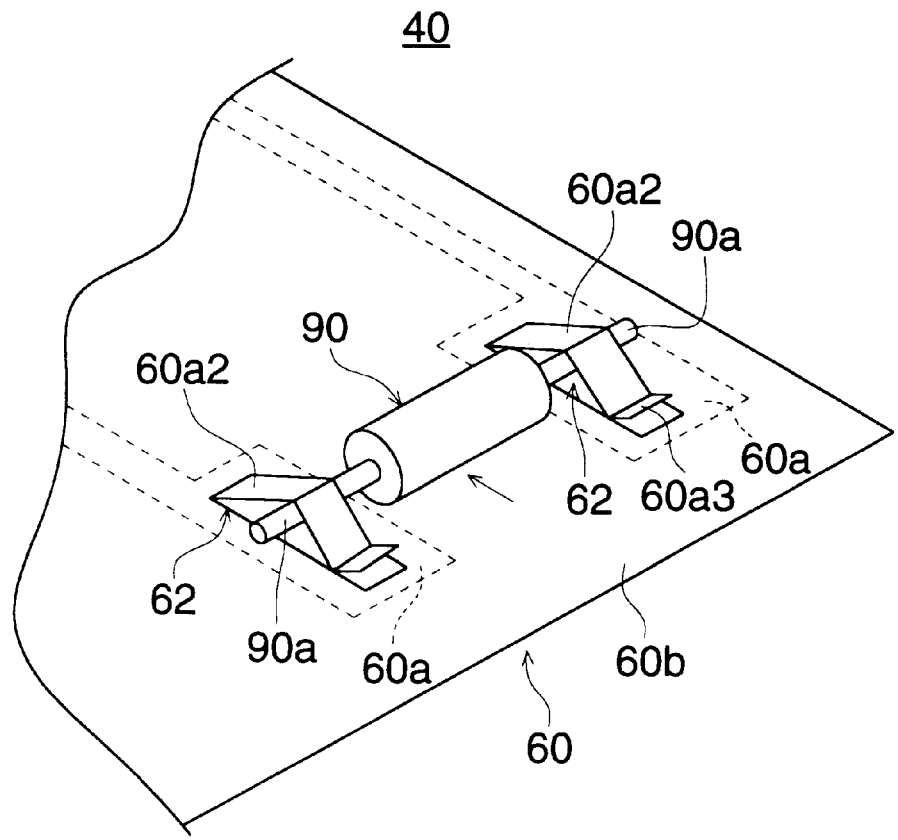
Figure 19:
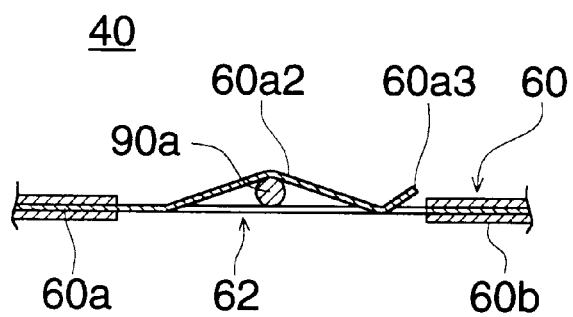

Each of FIGS. 19(*a*) and 19(*b*) is a diagram illustrating how to fix a lead wire on a metallic thin plate bent and exposed from a laminated board.

Figure 20:
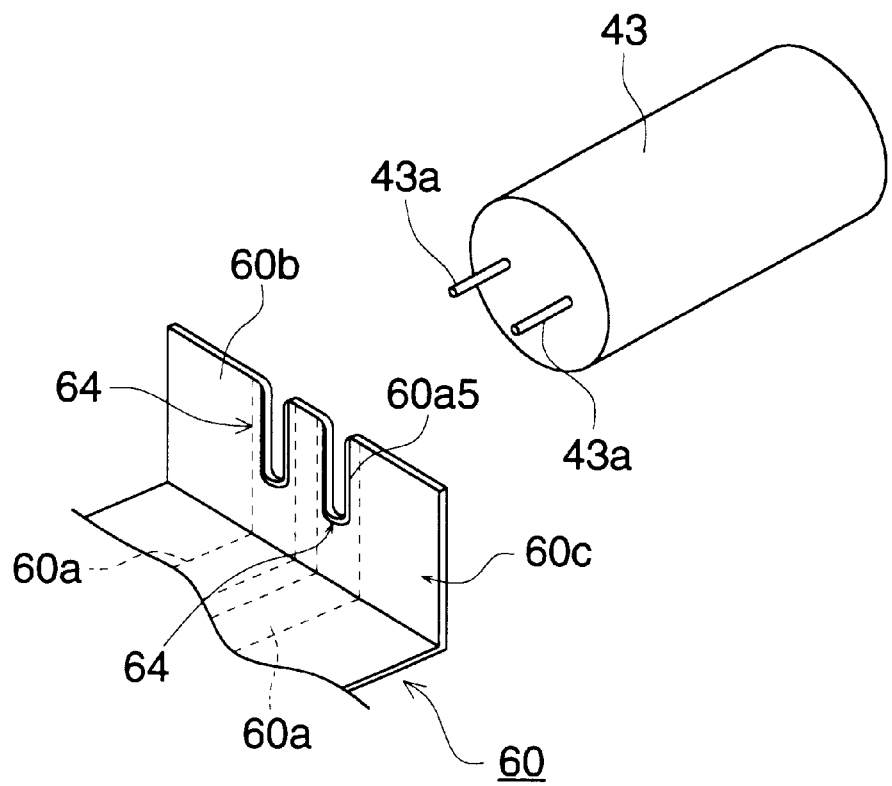
Figure 20:
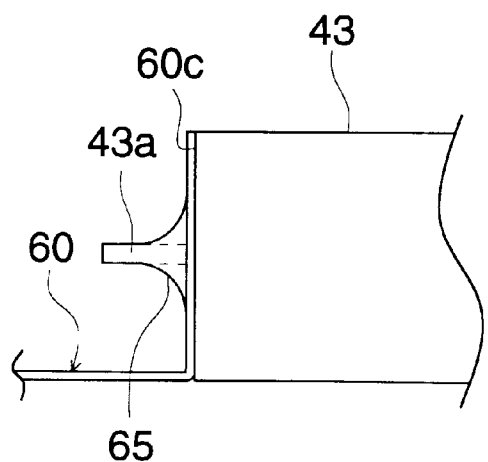

Each of FIGS. 20(*a*) and 20(*b*) is a diagram illustrating how to bend and edge portion of a laminated board and how to attach thereon a strobe capacitor.

Figure 21:
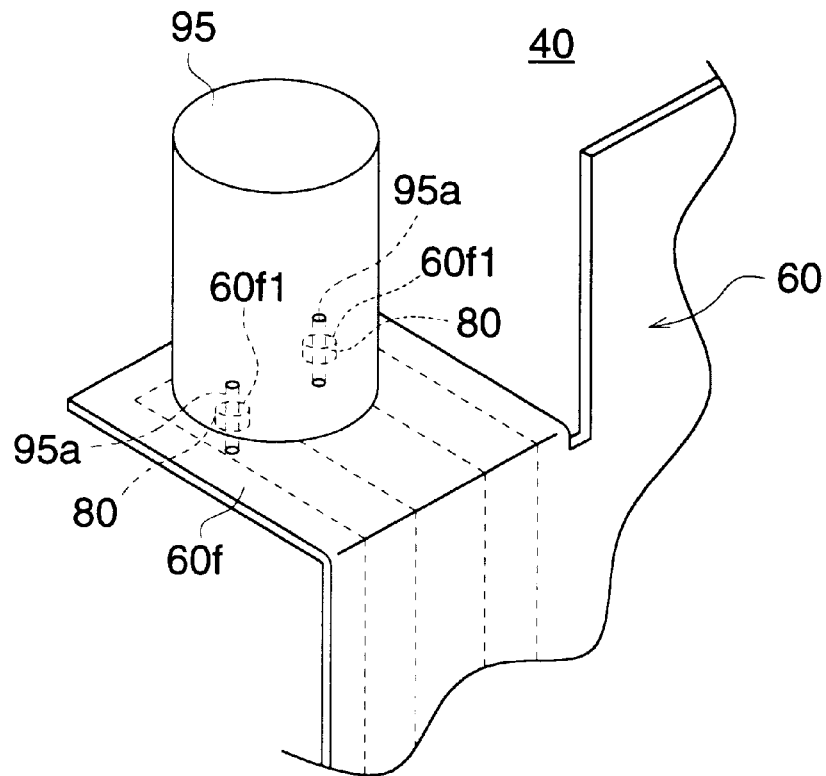
Figure 21:
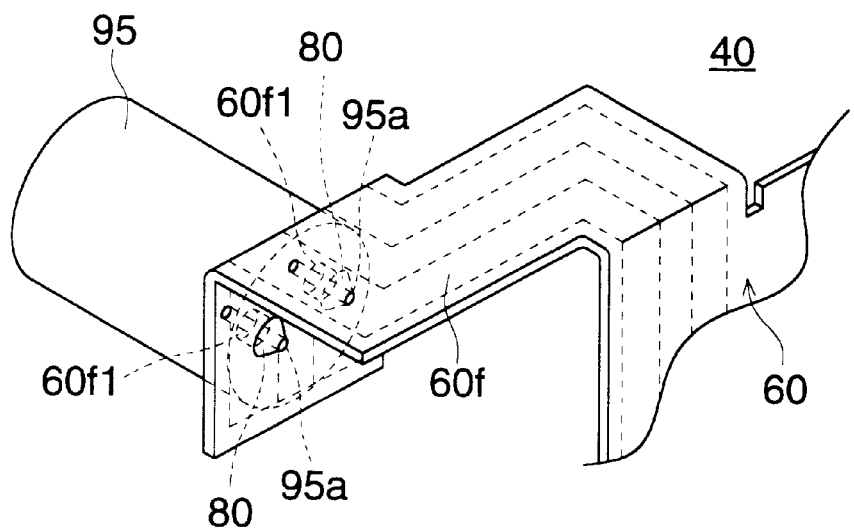

Each of FIGS. 21(*a*) and 21(*b*) is a diagram illustrating how to bend and edge portion of a laminated board and how to attach thereon a neon tube.

Figure 22:
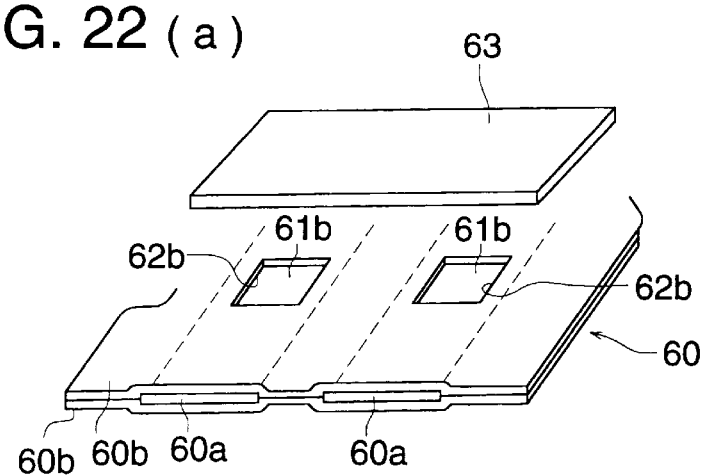
Figure 22:
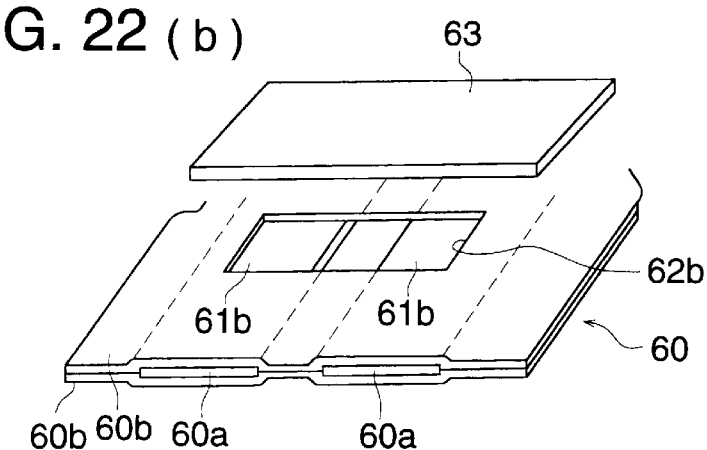
Figure 22:
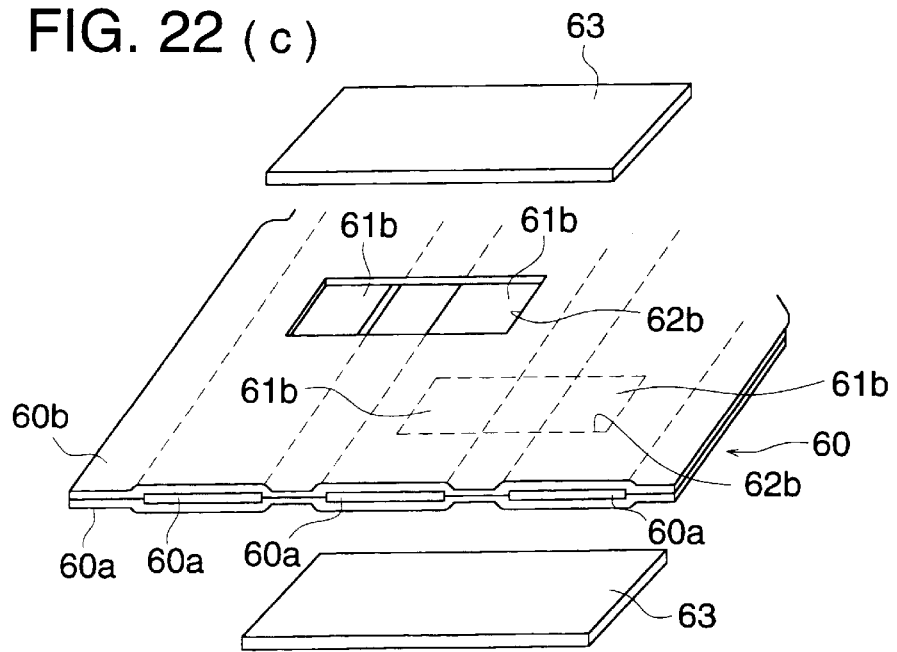

Each of FIGS. 22(*a*), 22(*b*) and 22(*c*) is a diagram illustrating how to attach a print resistor on a laminated board.

Figure 23:
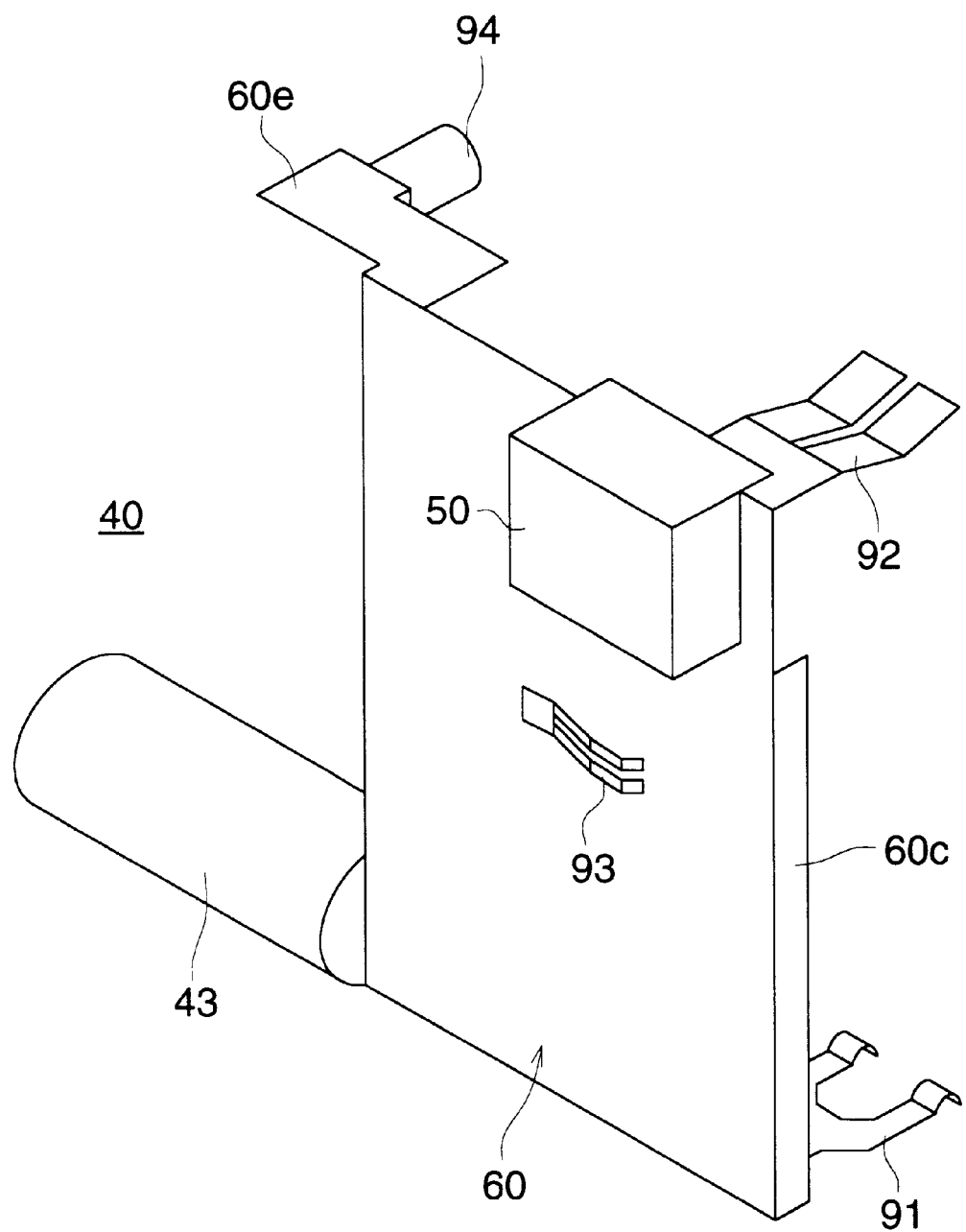

FIG. 23 is a perspective view of a strobe unit.

Figure 24:
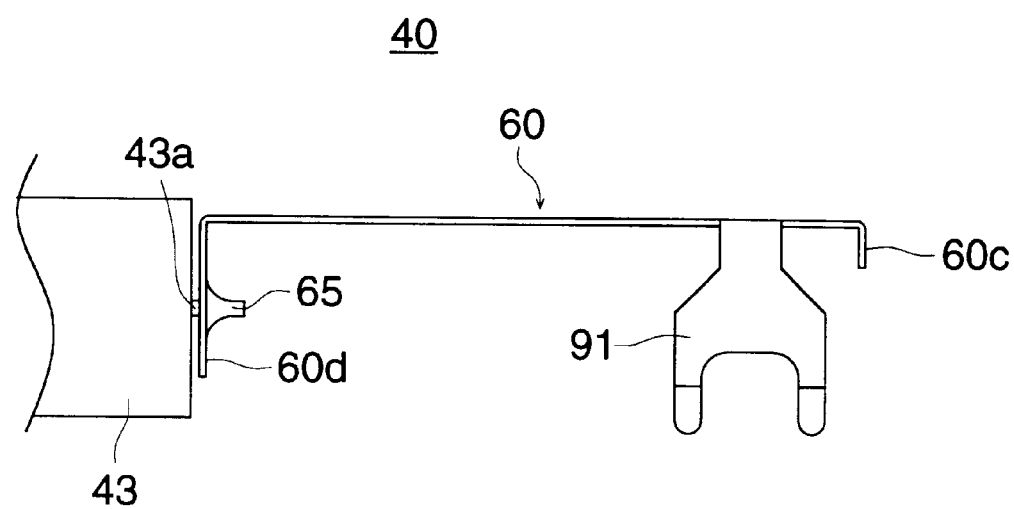

FIG. 24 is a side view of a strobe unit.

Figure 25:
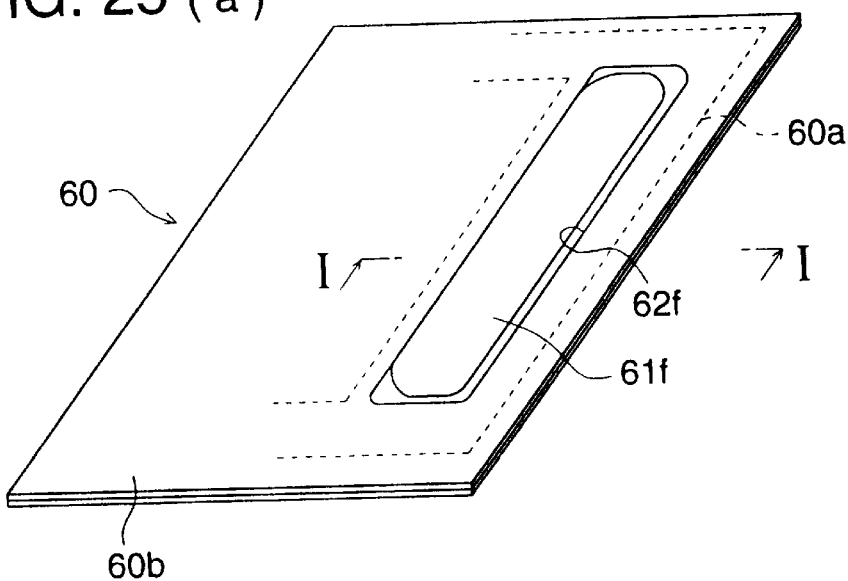
Figure 25:
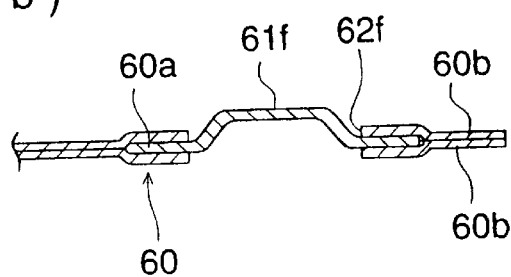
Figure 25:
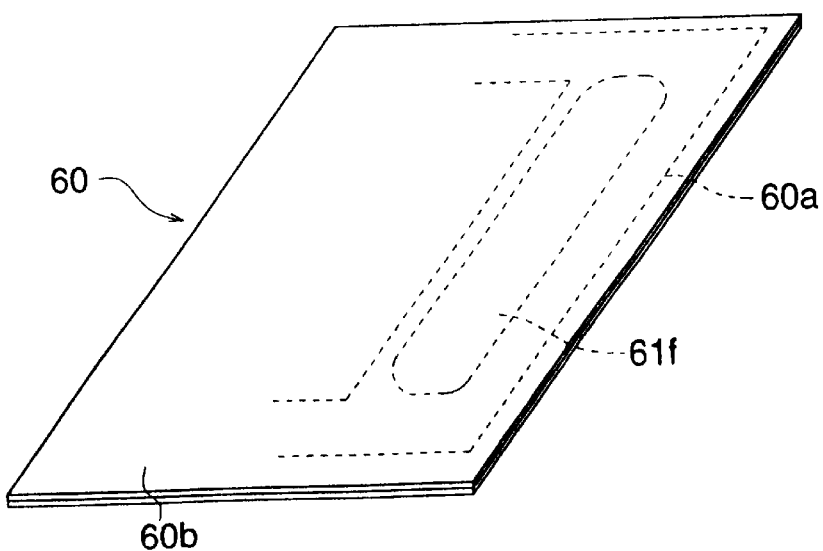

Each of FIGS. 25(*a*), 25(*b*) and 25(*c*) is a diagram showing drawing processing for a laminated board.

Figure 26:
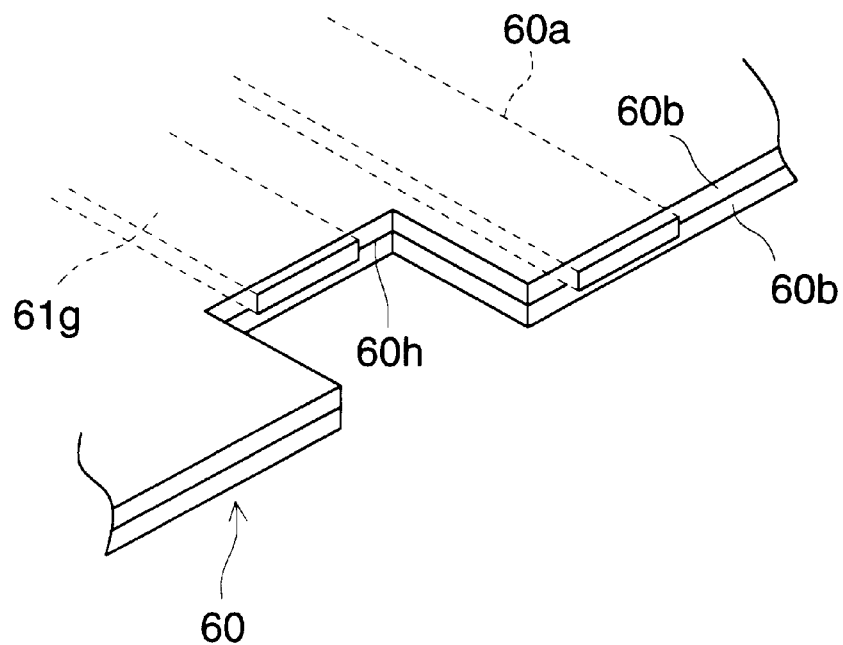
Figure 26:
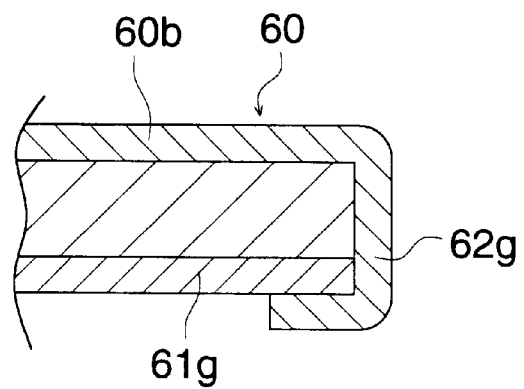

Each of FIGS. 26(*a*) and 26(*b*) is an illustration of electric shock prevention measures on an edge portion of a laminated board.

Figure 27:
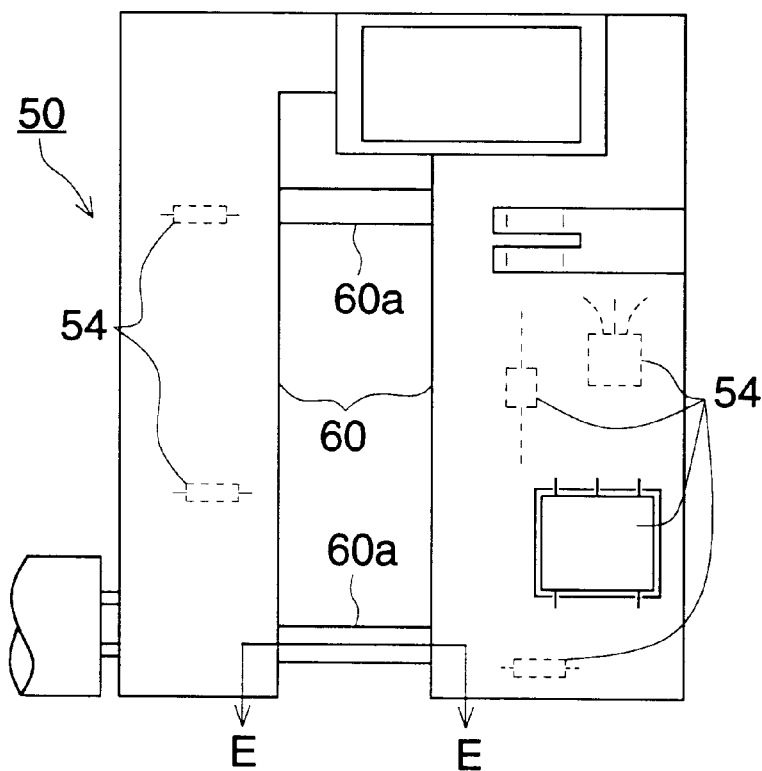
Figure 27:
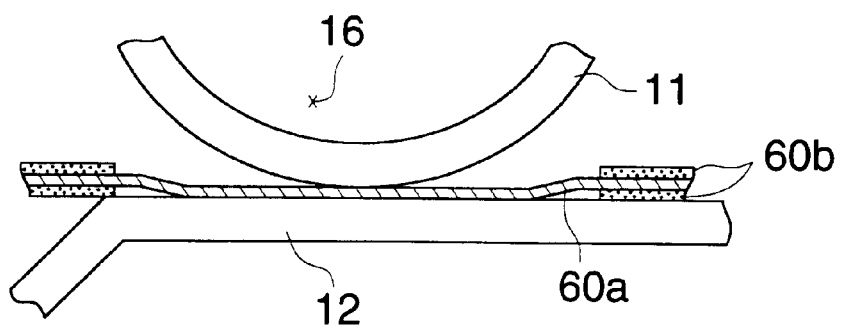
Figure 28:
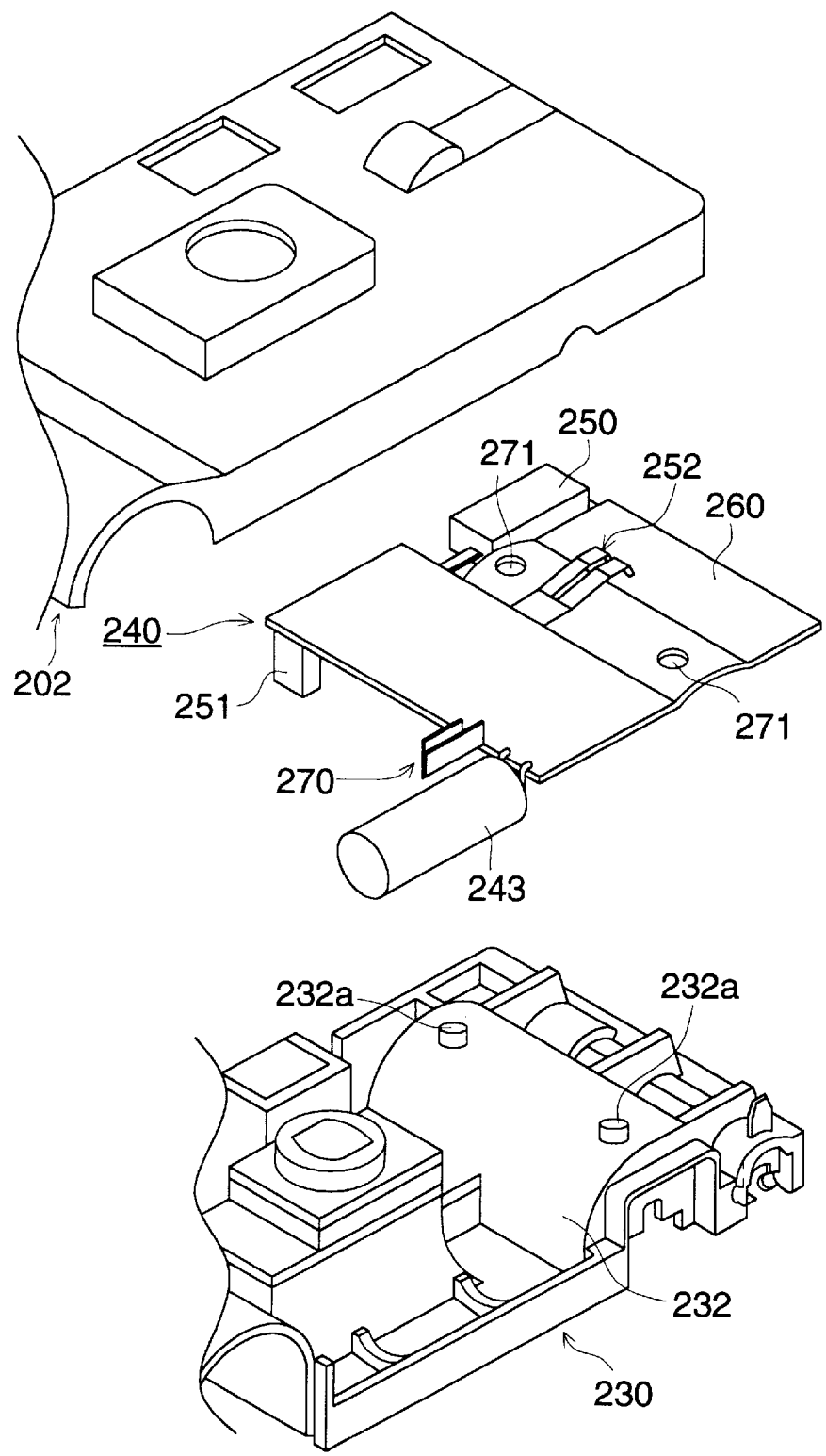

Each of FIGS. 27(*a*) and 27(*b*) is a diagram illustrating a circuit board that makes the lens-fitted film unit to be thinner FIG. 28 is a diagram showing how a strobe unit is incorporated in a lens-fitted film unit.

Figure 29:
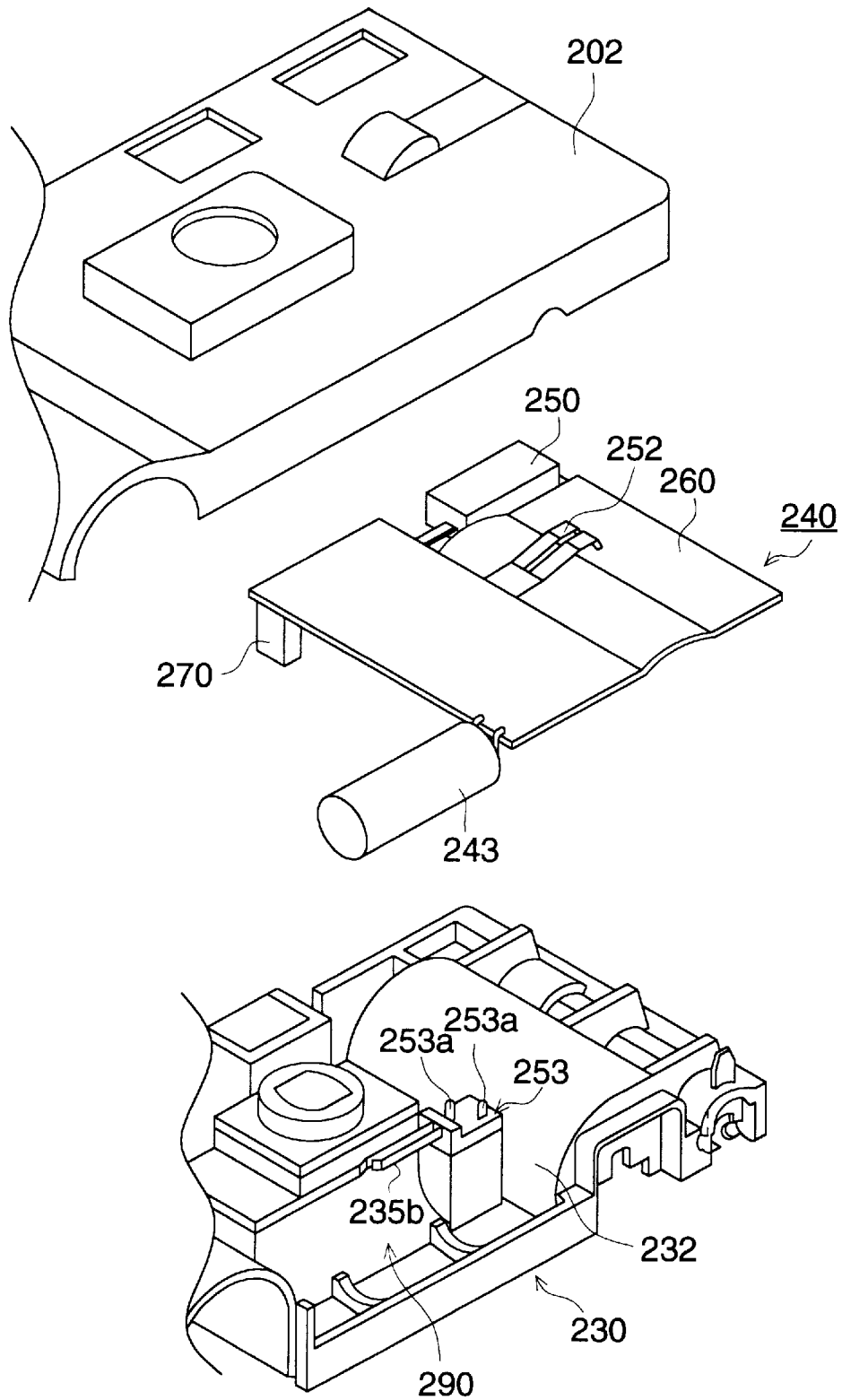

FIG. 29 is an exploded perspective view of a camera main body, a front cover and a strobe unit.

Figure 30:
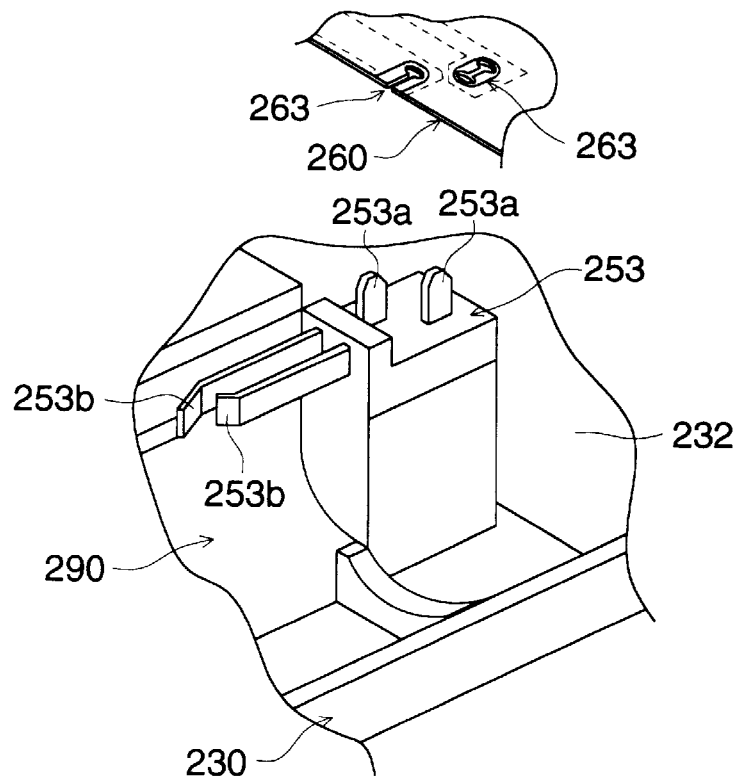
Figure 30:
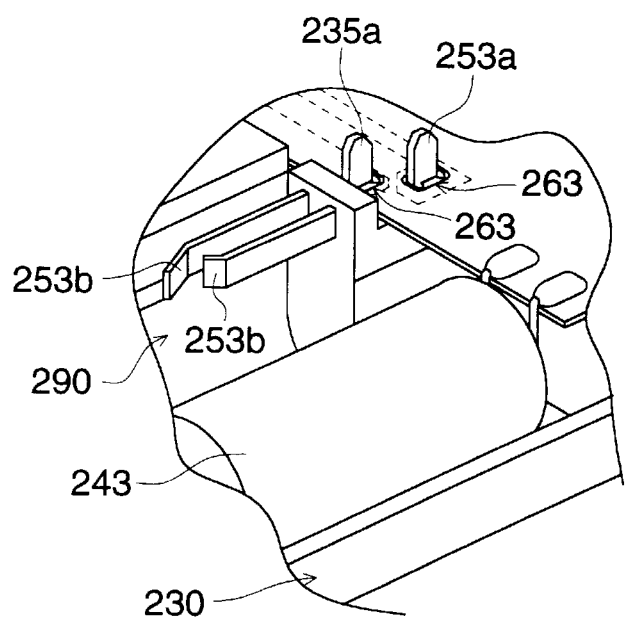

Each of FIGS. 30(*a*) and 30(*b*) is a diagram showing how to mount a strobe unit on a camera main body.

Figure 31:
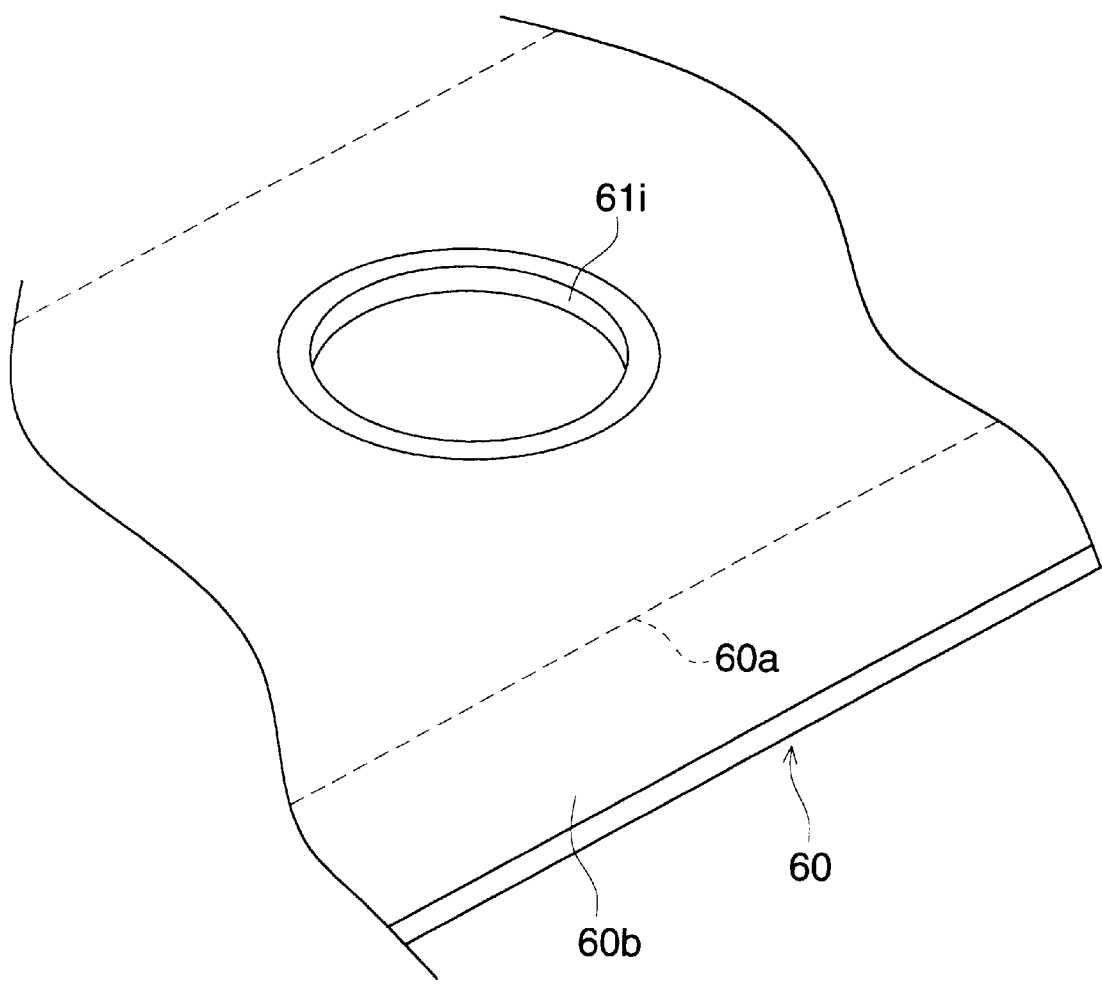

FIG. 31 is a diagram showing an embodiment wherein a positioning reference hole is formed on a laminated board.

Figure 32:
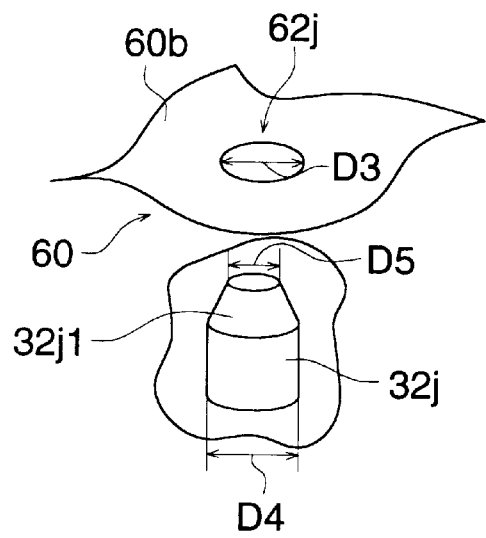
Figure 32:
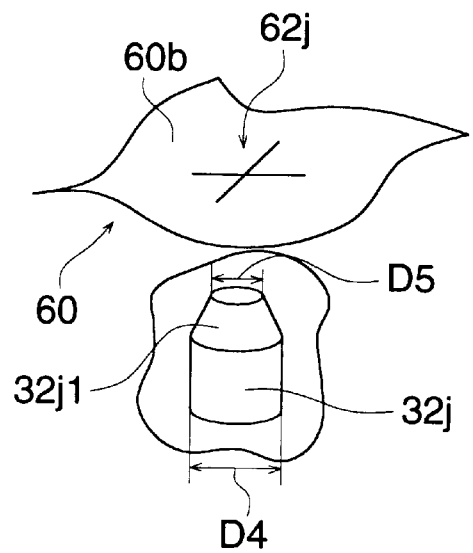
Figure 32:
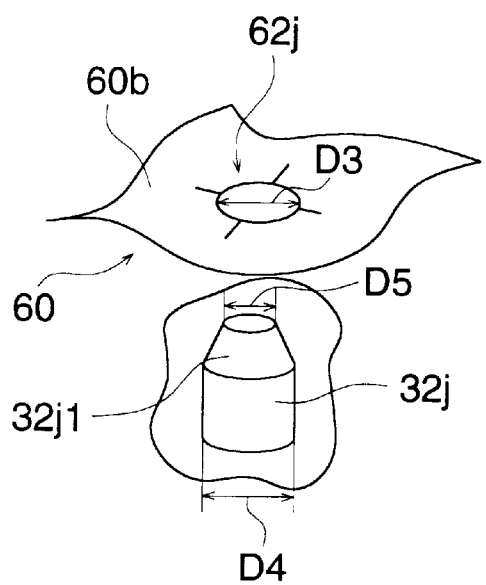
Figure 32:
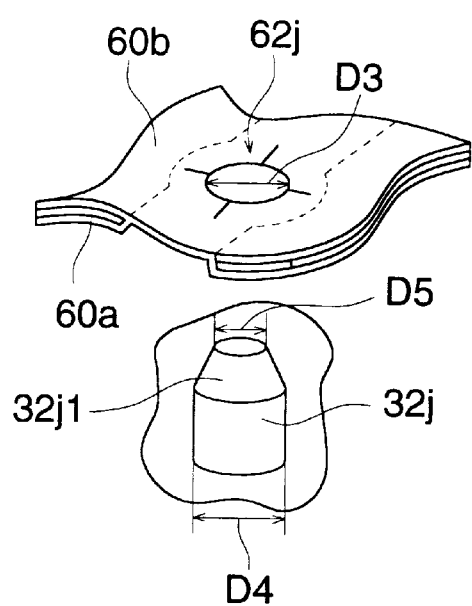

Each of FIGS. 32(*a*) to 32(*d*) is a diagram showing an embodiment wherein an engagement portion is formed on an insulating thin plate of a laminated board.

Figure 33:
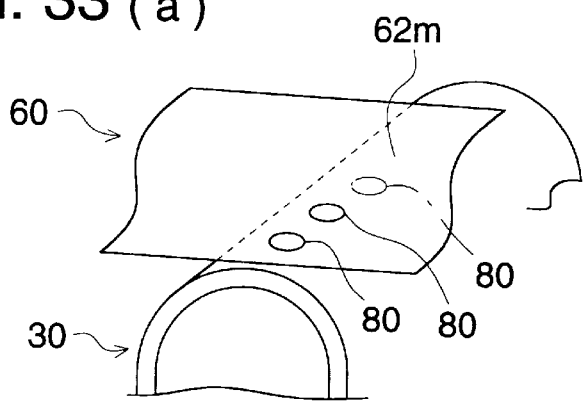
Figure 33:
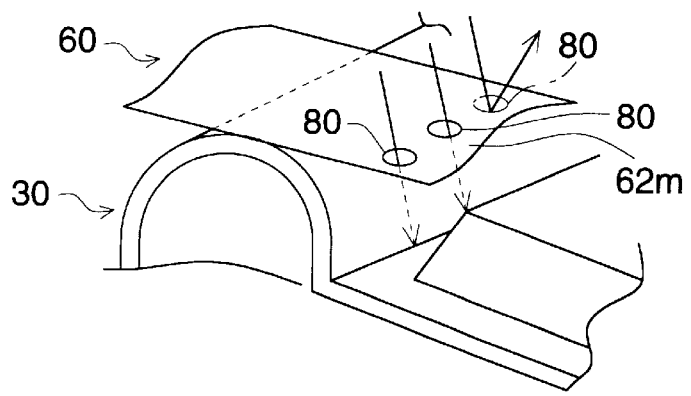
Figure 33:
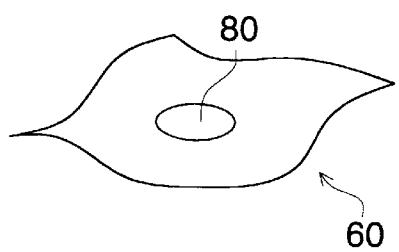
Figure 33:
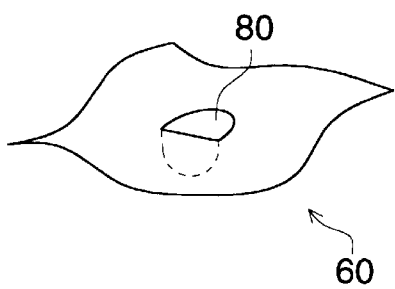
Figure 33:
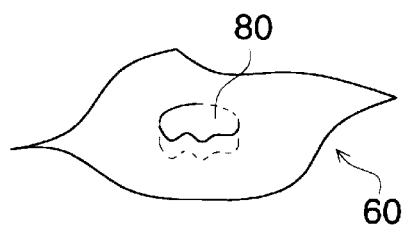

Each of FIGS. 33(*a*) to 33(*e*) is a diagram showing an embodiment wherein holes for recording information are made on an insulating thin plate of a laminated board.

Figure 34:
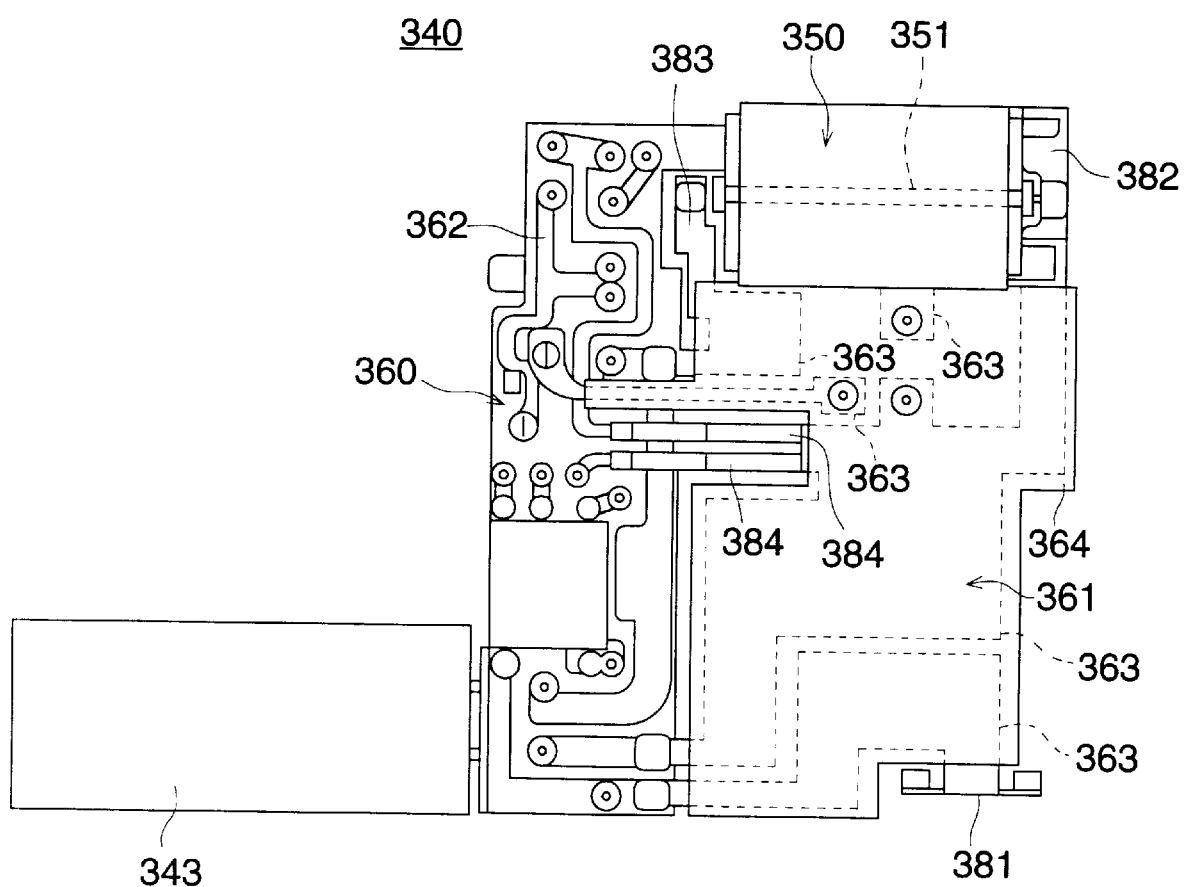

FIG. 34 is a front view of a strobe unit.

Figure 35:
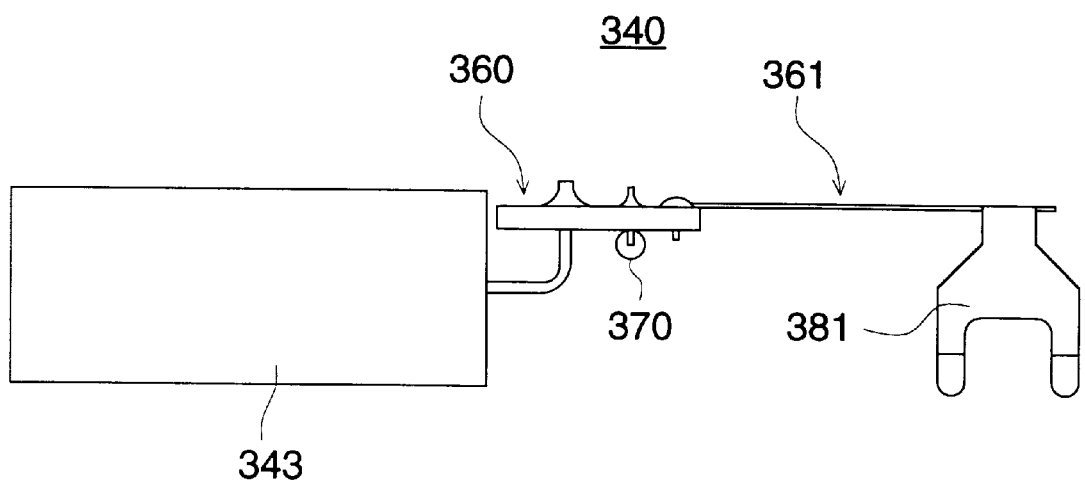

FIG. 35 is a bottom view of a strobe unit.

Figure 36:
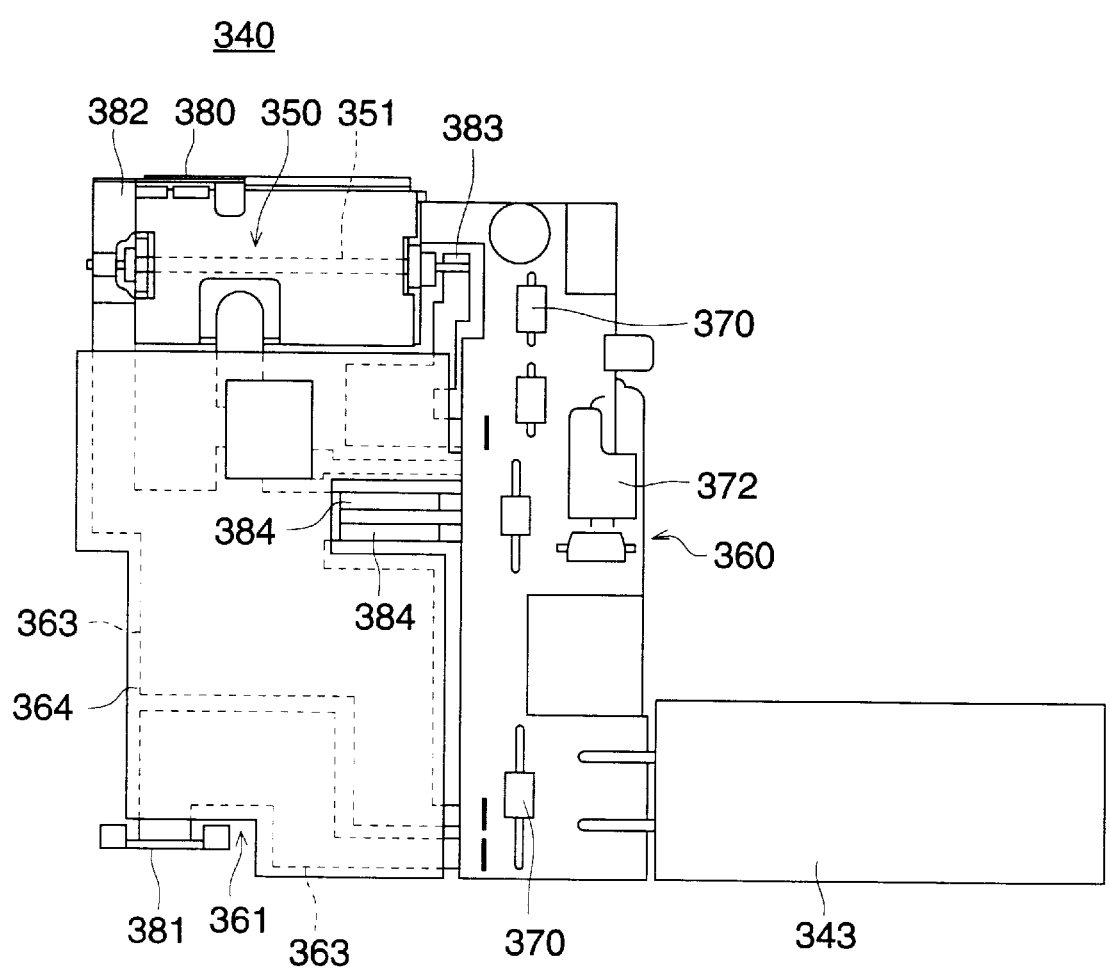

FIG. 36 is a rear view of a strobe unit.

Figure 37:
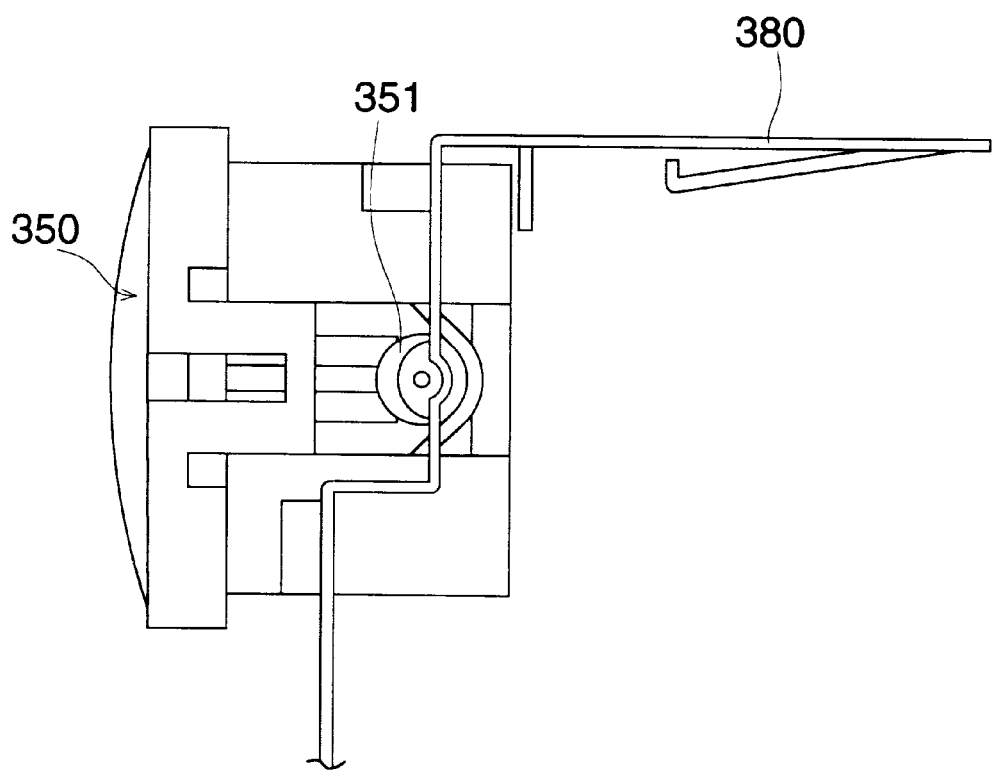

FIG. 37 is a side view of a luminescence portion and surroundings of a battery contact point.

Each of FIGS. 38(a) and 38(b) is a diagram showing an embodiment wherein a laminated board is connected from the parts side of a paper phenol board.

Each of FIGS. 39(a) and 39(b) is a diagram showing an embodiment wherein a laminated board is connected from the pattern side of a paper phenol board.

FIG. 40 is an exploded perspective view of a camera main body, a front cover and a strobe unit.

Figure 41:
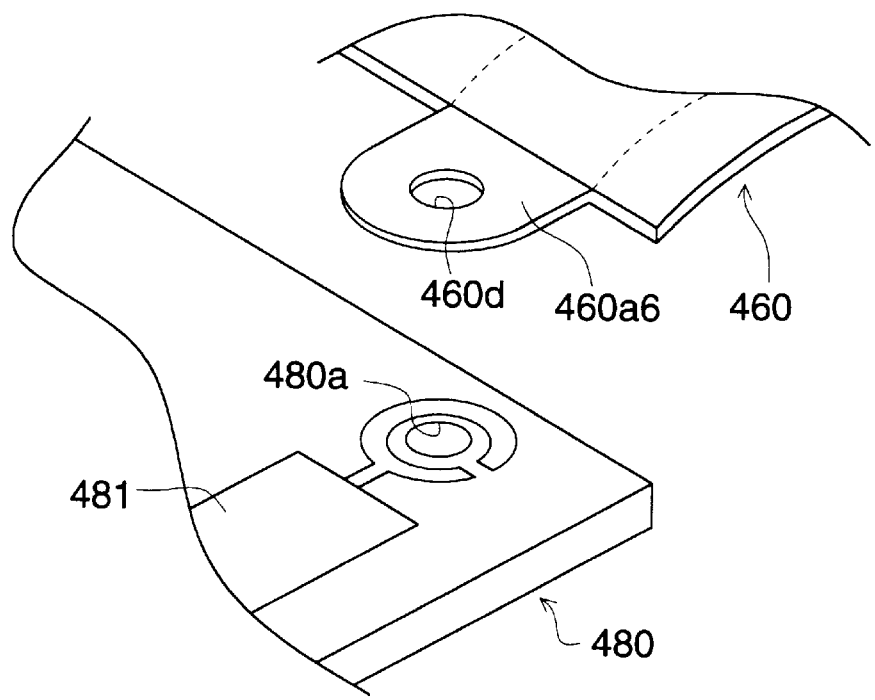
Figure 41:
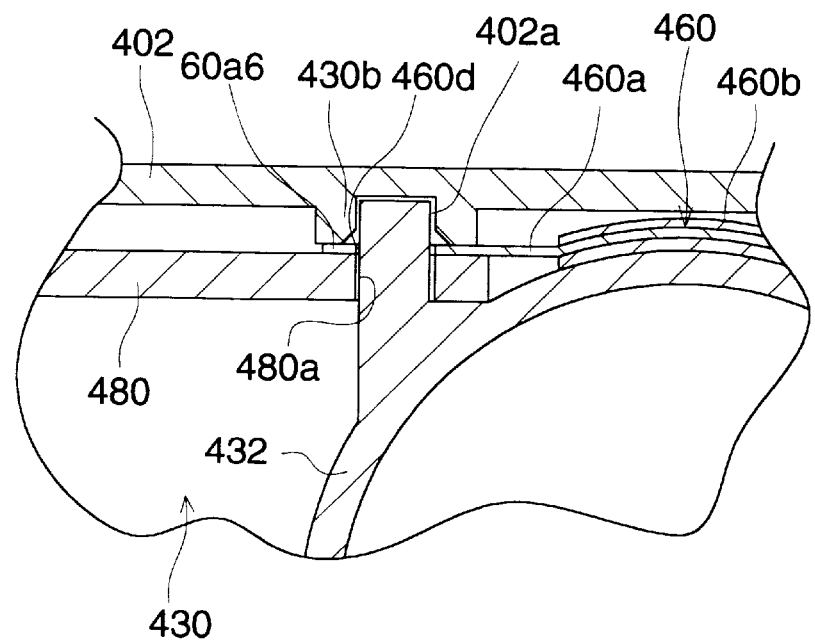

Each of FIGS. 41(a) and 41(b) is a diagram illustrating the connection between a paper phenol board and a laminated board.

DETAILED DESCRIPTION OF THE PREFERRED EMBODIMENT

The invention will be explained in detail, referring to FIGS. 1–12, and an example of an outline of a lens-fitted film unit used in the invention will be explained first, referring to FIGS. 1 and 2.

FIG. 1 is a perspective view of the front side of a lens-fitted film unit, and it also shows an enclosure that covers the lens-fitted film unit. FIG. 2 is an exploded perspective view which schematically illustrates the inside of the lens-fitted film unit.

The present lens-fitted film unit is a simple camera unit available on the market under the condition that a photographic film (hereinafter referred to as a film) is loaded in the camera unit. A film is loaded in a lens-fitted film unit in the course of its assembly process, and it is therefore possible for users to photograph instantly without necessity of loading and rewinding of the film.

Figure 2:
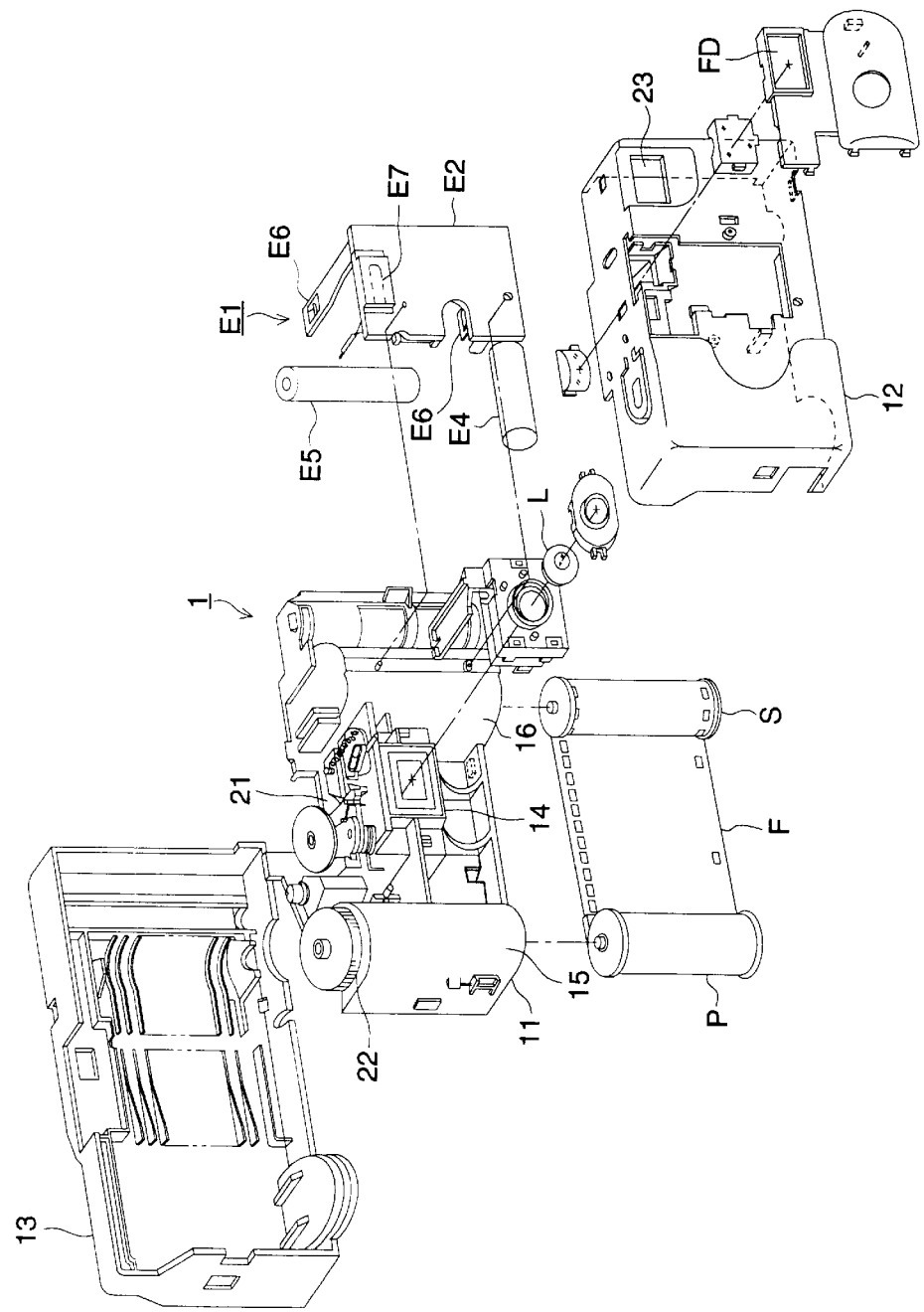
FIG. 2 is an exploded perspective view which schematically illustrates the inside of the lens-fitted film unit.

In FIGS. 1 and 2, the present lens-fitted film unit is structured in a manner that front cover 12 and rear cover 13 are attached on both sides of unit main body 11. At the center of the unit main body 11, there is provided photographing frame 14. On one side of the photographing frame 14, there is provided patrone chamber 15 for patrone P representing a cartridge for accepting a film, while on the other side of the photographing frame 14, there is provided film roll chamber 16. In the patrone chamber 15, there is loaded patrone P, while in the film roll chamber 16, there is loaded film F wound around spool S, and this film F is taken up by film winding mechanism 21 to be wound into the patrone P, by a length of one frame in each photographing.

As a patrone and a film used in this case, J 135 stipulated in the international standard ISO 1007 or a film cartridge (patrone) called 35 mm and ordinary J 135 or a film called 35 mm are naturally used. In addition, a cartridge capable of feeding out a film stored therein when a rotary shaft thereof is rotated such as that disclosed in TOKKAIHEI Nos. 3-126029, 2-272538 and 3-179342 and a film such as that disclosed in TOKKAIHEI No. 7-219146 may also be used.

The film winding mechanism 21 is composed of film winding knob 22 and other film winding mechanism parts, and it is arranged over the patrone chamber 15 and over the photographing frame 14, and photographing lens L is provided in front of the photographing frame 14. Further, view-finder FD is arranged over the photographing frame 14.

Lens-fitted film unit 1 is equipped with strobe unit E1. Strobe circuit board E2 of the strobe unit E1 is mounted on the front side of the film roll chamber 16. A circuit element is arranged on the strobe circuit board E2, and to the upper part of the strobe circuit board E2, there is connected xenon discharge tube E7 which faces strobe luminescence window 23 of the front cover 12.

To the lower part of the strobe circuit board E2, there is connected main capacitor E4, and battery E5 is connected to the strobe circuit board E2 through battery contact point E6. An electric current charged from the battery E5 to the main capacitor E4 causes the xenon discharge tube E7 to emit light. Under the strobe luminescence window 23, there is provided strobe switch knob E8 which is moved to turn on the power supply for photographing with a strobe.

The lens-fitted film unit 1 thus structured is covered by enclosure 19 made of paper for protecting the lens-fitted film unit 1 against shock on which directions and cautions are printed, openings such as strobe luminescence window hole HS, photographing lens section hole HL, view-finder hole HF, counter hole HC and strobe charging completion indication hole HI are formed at locations necessary for photographing functions, and design for better external appearance is given. The material for the enclosure may also be a plastic sheet or a seal-like one that is directly stuck to the camera main body to be fixed thereon, without being limited to paper.

Next, the structure of a strobe circuit of the strobe unit E1 will be explained, referring to FIG. 3.

Figure 3:
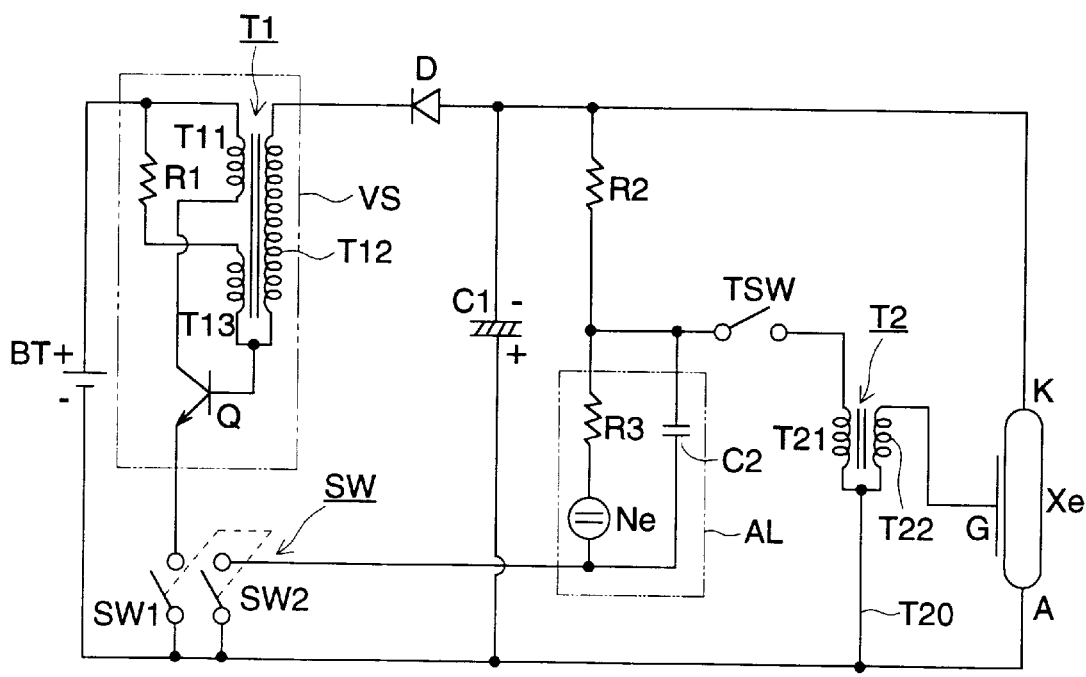
FIG. 3 is a circuit diagram of a strobe of the lens-fitted film unit.

In FIG. 3, BT represents a power supply such as a battery, and the battery BT is connected with step-up circuit VS encircled with 2-dot chain lines through switch element SW1 on one side of strobe switch SW interlocked with strobe switch knob E8. The step-up circuit VS is composed of transistor Q, oscillating transformer T1 having therein winding on primary side T11, winding on secondary side T12 and winding on tertiary side representing feedback winding T13 and resistor R1. and receives DC current from the battery BT to oscillate and thereby converts DC current into AC current.

The step-up circuit VS is connected with main capacitor C1 representing an electrolytic capacitor through diode D, and rectifies AC current supplied from the step-up circuit with diode D to charge it in main capacitor C1. The negative pole (−) and the positive pole (+) of the main capacitor C1 are connected respectively to cathode side terminal K and anode side terminal A of xenon discharge tube Xe to supply discharge current to the xenon discharge tube Xe.

To grid G of the xenon discharge tube Xe, there is connected a lighting circuit which is connected with a portion between a cathode and an anode of the main capacitor C1 through resistor R2, trigger switch TSW and trigger coil T2 having winding on primary side T21 and winding on secondary side T22. In this lighting circuit, when the trigger switch RSW is closed responding to the shutter operation, an electric current flows instantly to the winding on primary side T21 of the trigger coil T2 through the resistor R2, then pulse-shaped voltage generated on the winding on secondary side T22 responding to the electric current flow is given to grid G of xenon discharge tube Xe, thus the xenon discharge tube Xe emits light.

Further, warning circuit AL that indicates charging completion and warns an operator of failure to turn off a switch is connected to the lighting circuit. This warning circuit AL having therein a series circuit for both of resistor R3 and neon tube Ne and capacitor C2 connected in parallel with the series circuit is to be inserted between a mutual connection point for the resistor R2 and trigger switch TSW and switch element SW2 on the other side of the strobe switch SW. When the strobe switch SW is closed, this warning circuit AL is connected between both ends of the main capacitor C1 through the resistor R2, whereby the neon tube Ne is lit to indicate the charging completion and to warn an operator of failure to turn off a switch.

Next, operations of the strobe circuit will be explained.

First, when the strobe switch SW is closed by operation of strobe switch knob E8, the step-up circuit VS is connected with battery BT through switch element SW1 on one side of the strobe switch SW. Due to this, the step-up circuit VS is operated to output high voltage AC. This high voltage AC is rectified by diode D to be converted into DC which is charged into main capacitor C1. When a shutter-release button is pressed after the main capacitor C1 is fully charged to operate the shutter so that the trigger switch TSW is closed accordingly, voltage is impressed on grid G of xenon discharge tube Xe and thereby the xenon discharge tube Xe emits light for photographing with a strobe.

Charges electrified to the main capacitor C1 are supplied to the warning circuit AL through the resistors R2 and R3 and switch element SW2 on the other side of the strobe switch SW. In the warning circuit AL, capacitor C2 is charged by electric current supplied from the main capacitor C1, and this charging voltage is impressed on the series circuit for the resistor R3 and neon tube Ne, thus, the neon tube Ne starts discharging, namely it is lit. Responding to lighting of the neon tube Ne, charging voltage for the capacitor C2 continues to be lowered, and when it is lowered to a certain extent, the neon tube Ne stops discharging to be put out. After this, the capacitor C2 is charged again, and when the charging voltage is raised to be high, the neon tube Ne discharges again to be lit. Thus, the neon tube Ne goes on and off. Since this on-and-off luminescence serves also as indication of charging completion and warning of failure to turn off the strobe switch SW, if the strobe switch SW is turned off by setting strobe switch knob E8 to its off position, operations of entire circuits including the warning circuit AL are suspended.

Next, there will be explained, referring to FIGS. 3 and 4–12, the embodiments of the invention in terms of the strobe circuit mentioned above to which, however, the invention is not limited.

FIG. 4(*a*) is a diagram illustrating the basic structure of a circuit board of strobe unit 40 used for a lens-fitted film unit of the invention, and its sectional view is shown in FIG. 4(*b*).

In FIG. 4(*b*), 60*a* represents a metallic thin plate and 60*b* represents an insulating thin plate. As shown in FIG. 4 (*a*), a circuit pattern is punched on the metallic thin plate 60*a* and insulating thin plates 60*b* are glued and fixed on the metallic thin plate 60*a* to sandwich it as shown in the figure to make a laminated plate which is used as laminated board 60.

To be concrete, a circuit board representing a laminated plate is manufactured through the following steps; metallic thin plate 60*a* is made through the primary punching processing in which a pattern portion which is to be separated finally on the circuit pattern is surely connected with another pattern at a point, then, insulating thin plates 60*b* are glued and fixed on the metallic thin plate 60*a* which has been subjected to punching processing to cover its obverse side and reverse side, and the secondary punching processing is conducted to separate the pattern portion to be separated.

The metallic thin plate of the laminated plate mentioned above is about 0.07–0.2 mm in thickness, and the insulating thin plate is a resin film having a thickness of about 0.05–0.19 mm, therefore, even when three plates are stacked up as stated above, the maximum total thickness is about 0.58 mm. This value is usually 0.4 mm or less, which is about one third of the conventional circuit board whose thickness is about 1.2 mm.

For he metallic thin plate 60*a*, metallic materials such as tough pitch copper, phosphor bronze, brass and stainless steel are used, and metallic thin plate subjected to surface treatment such as solder-plating or nickel-plating is usually used. For the insulating thin plate 60*b*, a film of synthetic resin of polyamide type, polyimide type, compound polyester type or polyester type is used.

This thin laminated plate circuit can be bent to be of a three-dimensional shape as shown in FIG. 5(*b*), and its shape can be maintained by stiffness of the metallic thin plate. Therefore, it can be arranged efficiently in a space of a lens-fitted film unit, and it can also be removed or mounted again simply for its reuse.

FIGS. 5(*a*) to 5(*c*) are diagrams illustrating strobe unit 40 employing a circuit board made of the laminated thin plate and illustrating how the strobe unit 40 is incorporated in a lens-fitted film unit, wherein FIG. 5(*a*) is a front view of the strobe unit 40, and FIG. 5(*c*) is a sectional view taken on line V—V including the lens-fitted film unit shown in FIG. 5(*a*).

The circuit board 60 of the strobe unit 40 is located and attached between the front side of unit main body 11 forming film roll chamber 16 and front cover 12 as illustrated. Since the circuit board 60 is very thin, a narrow clearance between the front side of the unit main body 11 and the front cover 12 allows the strobe unit 40 to be attached on the lens-fitted film unit, if arrangement of strobe circuit parts on the circuit board 60 is considered in advance. Therefore, thin circuit board 60 can make a lens-fitted film unit to be thin in thickness and small in size.

Battery contact blade (+) 511, battery contact blade (−) 512 both representing a battery contact blade of battery BT, terminal contact blade 515 of cathode side terminal K representing a terminal contact blade of xenon discharge tube Xe (terminal contact blade of anode side terminal is located on the opposite side of the contact blade of the cathode side terminal) and strobe switch SW are all formed by a metallic thin plate constituting a laminated plate that forms the circuit board 60. Therefore, these battery contact blade (+) 511, battery contact blade (−) 512, terminal contact blade 515 of xenon discharge tube Xe and strobe switch SW do not need to be added separately, which contributes to cost reduction. Next, concrete example of them will be explained as follows.

FIGS. 6(*a*) and 6(*b*) are diagrams illustrating a battery contact blade, and FIG. 6(*a*) is a diagram illustrating a method to increase the resisting force of a battery contact blade for its elastic deformation, and FIG. 6(*b*) is a diagram illustrating another method to increase the resisting force for elastic deformation.

In FIGS. 6(*a*) and 6(*b*), battery contact blade (−) 512 is formed by metallic thin plate 60*a* of a laminated plate representing a circuit board as stated above, and, the resisting force of the battery contact blade for elastic deformation needs to be increased for stable contact to an electrode of the battery, because the metallic plate is thin. For that purpose, metallic plate 512*a* is welded on a corner portion where battery contact blade (−) 512 is bent as shown in FIG. 6(*a*). FIG. 6(*b*) shows that ribs 512*b* are provided on the battery contact blade (−) 512 to be protruded toward its reverse side at the corner portion thereof where the battery contact blade (−) 512 is bent.

Owing to the arrangement stated above, battery contact blade (−) 512 increases its stiffness and its resisting force for elastic deformation is made larger in addition to an effect of cost reduction, thus, the battery contact blade can be pressed to be brought into contact firmly with an electrode of the battery so that the strobe circuit may be operated stably. Making the resisting force of the battery contact blade for elastic deformation larger can naturally be applied also to battery contact blade (+) 511, terminal contact blade 515 of xenon discharge tube Xe and switch contact blade 51S of strobe switch SW to obtain the same effect as in the foregoing.

Next, the structure of a strobe switch will be explained as follows. Both switch contact blade 51S of the strobe switch SW and strobe switch land 513 which comes in contact with the switch contact blade 51S for continuity in FIG. 5(*a*) and both the switch contact blade 51S and strobe switch land 514 which comes in contact with the switch contact blade 51S for continuity in FIGS. 7(*a*) to 7(*c*) are all formed by metallic thin plate 60*a* of a laminate plate representing a circuit board as shown in illustrations. The switch contact blade 51S is formed by bending metallic thin plate 60*a* as shown in FIG. 7(*a*), and its tip is forked as shown in FIG. 5(*a*) to be brought into contact respectively with strobe switch land 513 and strobe switch land 514 for continuity, thus, switch elements SW1 and SW2 shown in the strobe circuit diagram in FIG. 3 are formed.

As stated above, the strobe switch SW which is relatively complicated can be formed by metallic thin plate 60*a* of a laminated plate and insulating thin plate 60*b* without adding parts newly, which is a great effect of cost reduction.

In the case of a strobe switch having the shape shown in FIGS. 7(*a*) and 7(*b*), a fulcrum of the switch contact blade 51S is located at the portion where the switch contact blade is bent by about 180°. However, when the switch contact blade 51S is made to have the shape shown in FIG. 7(*c*), the fulcrum is not located at the portion that is bent by about 180°, but it is located at fulcrum PO portion that is closer to the tip of the switch contact blade than the portion bent by about 180° and is bent gently in terms of angle, thus durability is improved.

Now, referring to FIG. 8, there will be explained a strobe switch wherein plural metallic thin plates 60*a* and plural insulating thin plates 60*b* both of the laminated plate are superposed alternately, and a switch is structured between the stacked metallic thin plates.

In FIG. 8, the strobe switch SW is of a structure wherein metallic thin plates and insulating thin plates are stacked alternately as illustrated. Namely, the uppermost layer illustrated is insulating thin plate 521 under which the metallic thin plate 516 that comes in contact with a longer tip of the switch contact blade 51S for continuity sandwiches insulating thin plate 522 thereunder, and metallic thin plate 518 that comes in contact with a shorter tip of the switch contact blade 51S for continuity and metallic thin plate 517 that is brought into contact with the metallic thin plate 516 for continuity by rivet 53 sandwich insulating thin plate 523 thereunder, whereby metallic thin plate 60*a* forming switch contact blade 51S and lowermost insulating thin plate 524 form the strobe switch. In the locations where the longer tip and the shorter tip of the switch contact blade 51S operate, there are provided holes on the metallic thin plate and insulating thin plate as a space where the tips operate.

Namely, in this strobe switch, plural metallic thin plates and plural insulating thin plates are stacked alternately, and a switch is formed between the stacked metallic thin plates. Plates on both ends sandwiching the metallic thin plates and insulating thin plates stacked alternately may be either an insulating plate as stated above, or a metallic thin plate if unnecessary. Connection between metallic thin plates for their continuity may also be achieved by a screw, welding, soldering by means of a solder or by a jumper wire, in addition to the rivet mentioned above.

FIGS. 9(*a*) to 9(*c*), 10(*a*) and 10(*b*) and 11(*a*) to 11(*c*) represent diagrams showing other examples of a trigger switch for strobe luminescence. In the example in FIG. 9(*a*), trigger switch for strobe luminescence 70 composed of fixed contact point 70*a* and movable contact point 70*b* as shown in FIG. 9(*a*) is formed solidly with a part of metallic thin plate 60*a* of laminated board 60. Namely, the fixed contact point 70*a* and the movable contact point 70*b* are formed by bending a part of metallic thin plate 60*a* protruded from the end portion of laminated board 60 shown in FIG. 9(*b*) showing the state before bending so that they face each other as shown in FIG. 9 (*c*) showing the state after bending, and tip portion 70*b*1 of the movable contact point 70*b* is further bent toward the fixed contact point 70*a* to be brought into contact with the fixed contact point 70*a* for continuity when the tip portion 70*b*1 is operated. Width D1 of the fixed contact point 70*a* is arranged to be greater than width D2 of the movable contact point 70*b*.

Trigger switch for strobe luminescence 70 is formed by using a part of metallic thin plate 60*a* as stated above, and is united simply and firmly with laminated board 60, which results in a low cost. When movable contact point 70*b* of trigger switch for strobe luminescence 70 is pressed toward the movable contact point 70*b* by release mechanism 37, its tip portion 70*b*1 comes in contact with the fixed contact point 70*a* for continuity and thereby trigger signals for strobe luminescence are obtained. In this case, width D1 of the fixed contact point 70*a* is arranged to be greater than width D2 of the movable contact point 70*b*, and thereby the fixed contact point 70*a* has its prescribed strength, thus, no positional displacement is caused by switching on operation of the movable contact point 70*b*, resulting in a constant shutter speed.

In an embodiment shown in FIGS. 10(*a*) and 10(*b*), trigger switch for strobe luminescence 70 composed of fixed contact point 70*a* and movable contact point 70*b* is formed solidly with a part of metallic thin plate 60*a* of laminated board 60 as shown in FIG. 10(*a*). Namely, the fixed contact point 70*a* is formed in a manner wherein opening 62*a* is formed on a part of insulating thin plate 60*b* so that a part of metallic thin plate 60*a* may be exposed. The movable contact point 70*b* is formed in a manner wherein a part of metallic thin plate 60*a* formed, as shown in FIG. 10(*b*) showing the state before bending, to be protruded from an end portion of laminated board 60 is bent as shown in FIG. 10(*a*).

Trigger switch for strobe luminescence 70 is formed by using a part of metallic thin plate 60*a* as stated above, and is united simply and firmly with laminated board 60, which results in a low cost. The fixed contact point 70*a* of trigger switch for strobe luminescence 70 can be formed simply by making a part of metallic thin plate 60*a* to be exposed, and it has its prescribed strength, and no positional displacement is caused by switching on operation of the movable contact point 70*b*, resulting in a constant shutter speed.

In an embodiment shown in FIGS. 11(*a*) and 11(*b*), a part of metallic thin plate 60*a* of laminated board 60 is used for forming switch 75 composed of fixed contact point 75*a* and movable contact point 75*b* solidly. Namely, FIG. 11(*a*) shows the state before bending the movable contact point 75*b*, while FIG. 11(*b*) shows the state after bending the movable contact point 75b, and the fixed contact point 75a is formed by forming opening 62d on a part of insulating thin plate 60b and thereby by making a part of metallic thin plate 60a to be exposed. With regard to the movable contact point 75b, a part of metallic thin plate 60a is made to be protruded from an end portion of laminated board 60, and this part is folded and the folded portion 75c is fixed, through soldering by means of solder 76, on exposure portion 75d wherein opening 62d is formed on a part of insulating thin plate 60b. As explained above, the switch 75 is united simply and firmly with laminated board 60, resulting in a low cost. Moreover, the movable contact point 75b of the switch 75 has its prescribed strength because the folded portion 75c of the movable contact point 75b of the switch 75 is fixed firmly, through soldering by means of solder 76, on the exposure portion 75d formed by a part of metallic thin plate 60a, thus, switching on operation for bringing tip portion 75e into contact with the fixed contact point 75a for continuity can be conducted firmly.

The strobe switch SW thus structured can be applied to a strobe switch of any type, and strobe switches of any types can be made by making them of a structure of laminated board.

The circuit board of a laminated board type makes it possible, when it is made through press molding, to form a reflector of a xenon discharge tube. This is explained in FIG. 12.

FIG. 12 represents a diagram wherein lead wire portion 51M representing a lead wire which applies trigger charges on xenon discharge tube Xe so that it emits light is provided at the location which is not related to reflection of strobe light by a reflector on a laminated board representing a circuit board which is then subjected to press molding to be a shape of a parabolic mirror as a reflector of the xenon discharge tube Xe, and an insulating thin plate placed on the inside of the reflector to prevent occurrence of scratches caused by press molding is removed.

The reflector thus formed can represent a reflector of the xenon discharge tube when it is housed in a resin-molded container for housing a reflector with aforesaid lead wire portion showing itself, which makes a conventional reflector made separately unnecessary to achieve cost reduction.

An example wherein strobe circuit parts are attached on a circuit board through soldering will be explained, referring to FIGS. 13(a) to 13(c). FIG. 13(a) shows how to attach a resistor, a capacitor or a diode, FIG. 13(b) shows how to attach a transistor or the like, and FIG. 13(c) shows how to attach a oscillating transformer and others.

In FIG. 13(a), metallic thin plate 60a of circuit board 60 representing a laminated plate is bent, and a lead wire for resistor R1, R2 or R3, or for capacitor C2 or diode D is inserted in a U-shaped cut-out on the tip portion of the bent portion to be soldered, provided, however, that the insulating thin plate at the above-mentioned portion is cut off to make hole 55 as illustrated. In FIG. 13(b), circuit board 60 is provided thereon with small hole 56 through which a leg of a lead wire of transistor Q is threaded to the reverse side to be bent, and metallic thin plate 519 whose land is made at the position of the small hole is soldered. In FIG. 13(c), a hole through which oscillating transformer T1 can be inserted is made on circuit board 5, and the oscillating transformer T1 is inserted from the reverse side, and a lead wire provided on an end of the oscillating transformer T1 is soldered on metallic thin plate 519 on which a land is made.

FIGS. 14(a) to 14(b) represents a concrete example of what is shown in FIG. 13(a), wherein terminal contact blade 515 of xenon discharge tube Xe is made of metallic thin plate 60a of a laminated plate representing a circuit board, and each of cathode side terminal K and anode side terminal A of the xenon discharge tube Xe is soldered in each U-shaped cut-out on terminal contact blade 515. Circuit board 60 that is made of a laminated plate is composed of metallic thin plate 60a and insulating thin plate 60b as stated above, and each of terminal contact blades at both ends of the xenon discharge tube Xe is also formed by the metallic thin plate 60a, thus, terminal contact blades which have been made additionally are not necessary and the number of parts is reduced, resulting in an effect of the cost reduction.

FIGS. 15(a) to 15(c) represents a concrete example of what is shown in FIG. 13(a), wherein laminated board 60 is fixed for continuity in a manner wherein a part of the metallic thin plate 60a is cut to be lifted to form a pair of lifted portions 60a1, and a U-shaped cut-out whose width is smaller than a diameter of lead wire 90a of electronic part 90 is formed on each of the paired lifted portions 60a1, and the lead wire 90a of the electronic part 90 is inserted in the cut-out 60a2.

Owing to the fixing for continuity by cutting and lifting a part of laminated board 60 and by inserting lead wire 90a of electronic part 90 into cut-out 60a2 formed on the lifted portion 60a1 as stated above in the same manner as in xenon discharge tube Xe in FIG. 14(a), the actual mounting can be completed only through the step for inserting lead wire 90a of electronic part 90 into cut-out 60a2 on the laminated board 60, which reduces man-hour for assembly. If the electronic part 90 is fixed, it is possible to replace the electronic part 90 easily, when it is found to be damaged in the course of assembly of a strobe unit or in the course of inspection for the reuse. Further, the lead wire 90a may further be soldered after being inserted for the portion where a heavy current flows or high voltage is impressed.

FIGS. 16(a) to 16(c), 17(a) to 17(c) and 18(a) and 18(b) represent an improved example of what is shown in FIG. 13(b). On laminated board 60 in FIG. 16(a) to 16(c), there is formed (+)-shaped hole 61 into which lead wire 70a of electronic part 70 is inserted forcibly to be fixed for continuity. The (+)shaped hole 61 is formed through press working simultaneously with formation of the metallic thin plate 60a, and both sides are covered by insulating thin plates 60b in a manner that the periphery of portion 60a1 where the (+)-shaped hole 61 is formed is exposed in a circular form.

Accordingly, when the lead wire 70a of electronic part 70 is inserted forcibly into the (+)-shaped hole 61 in the arrowed direction, portion 60a1 of the metallic thin plate 60a where the (+)-shaped hole 61 is formed is bent to form a stopper. Due to this, lead wire 70a of electronic part 70 can be fixed for continuity on thin laminated board 60, without being soldered. and the electronic part 70 can be removed more easily compared with an occasion where soldering is used. which makes circuit maintenance easy. When a heavy current flows through the electronic part 70, the lead wire 70a which has been inserted forcibly in (+)-shaped hole 61 may also be fixed for continuity through soldering.

On laminated board 60 of strobe unit 40 in an embodiment shown in FIGS. 17(a) to 17(c), there is formed (−)-shaped hole 63 into which connection portion 45a of battery contact blade 45 is inserted forcibly to be fixed for continuity. The (−)shaped hole 63 is formed through press working simultaneously with formation of the metallic thin plate 60a, and both sides are covered by insulating thin plates 60b in a manner that the periphery of portion 60a4 where the (−)-shaped hole 63 is formed is exposed in a square form.

Accordingly, when the connection portion 45a of battery contact blade 45 is inserted forcibly into the (−)-shaped hole 63 in the arrowed direction, portion 60a4 of the metallic thin plate 60a where the (−)-shaped hole 63 is formed is bent to form a stopper. Due to this, the connection portion 45a of battery contact blade 45 can be fixed for continuity on thin laminated board 60, without being soldered. and the battery contact blade 45 can be removed more easily compared with an occasion where soldering is used. which makes circuit maintenance easy. When a heavy current flows through the battery contact blade 45 the battery contact blade 45 which has been inserted forcibly in (−)-shaped hole 63 may also be fixed for continuity through soldering.

It is also possible to form a (+)-shaped hole in place of the (−)-shaped hole 63 and to fix the connection portion 45a of battery contact blade 45 for continuity through forced insertion.

On laminated board 60 of strobe unit 40 in an embodiment shown in FIGS. 18(a) and 18(b), there is formed (−)-shaped hole 63 in the same manner as in the embodiment in FIG. 17. On the portion forming battery chamber 100 of camera main body 30, there is formed battery contact blade 45 to be inserted therethrough, and connection portion 45a of the battery contact blade 45 is protruded from the surface of the laminated plate 60 which comes in contact with camera main body 30 when the laminated board is attached on the camera main body. When the laminated plate 60 is mounted on the camera main body 30, the connection portion 45a of the battery contact blade 45 is inserted forcibly into the (−)-shaped hole 63 on the laminated plate 60 to be fixed for continuity. Owing to the arrangement wherein battery contact blade 45 is formed to be inserted and fixed in camera main body 30 as stated above, positional accuracy is improved and electrical connection with a battery is stabilized.

In the case of strobe unit 40 in the embodiment shown in FIGS. 19(a) and 19(b), U-shaped cut-out 62 is formed on laminated plate 60, and lead wire 90a of electronic part 90 is sandwiched in the U-shaped cut-out 62 to be fixed for continuity. This U-shaped cut-out 62 is formed in a manner wherein it is subjected to press working simultaneously with formation of metallic thin plate 60a, then portion 60a2 where the U-shaped cut-out 62 is formed is bent in a crank shape, its tip portion 60a3 is located to be away from the part-mounting surface, and both sides are covered by insulating thin plates 60b so that the portion 60a2 where the U-shaped cut-out 62 is formed may be exposed.

Due to the foregoing, when the lead wire 90a of the electronic part 90 is positioned at the tip portion 60a3 of the portion 60a2 where the U-shaped cut-out 62 is formed, to be inserted forcibly in the arrowed direction, the portion 60a2 of the metallic thin plate 60a where the U-shaped cut-out 62 is formed catches the lead wire to serve as a stopper as shown in FIG. 19(a). Due to this, the lead wire 90a of the electronic part 90 can be fixed on thin laminated board 60 for continuity, without being soldered. and the electronic part 90 can be removed more easily compared with an occasion where soldering is used. which makes circuit maintenance easy. When a heavy current flows through the electronic part 90, the lead wire 90a inserted in the U-shaped cut-out 62 may also be fixed for continuity through soldering.

In the case of laminated board 60 of strobe unit 40 in the embodiment shown in FIGS. 20(a) and 20(b), its end portion 60c is bent to be provided thereon with a pair of cut-outs 64, and terminals 43a of strobe capacitor 43 are engaged with the cut-outs 64 to be fixed by solder 65 for continuity. This cut-out 64 is formed in a manner wherein it is subjected to press working simultaneously with formation of metallic thin plate 60a, then both sides are covered by insulating thin plates 60b so that the portion 60a5 where the cut-out 64 is formed may be exposed, and the end portion 60c is bent. Stiffness is increased by bending the end portion 60c of laminated board 60. The terminal 43a of the strobe capacitor 43 can easily be fixed for continuity on the laminated board 60 without being bent, and the number of processes for the strobe capacitor 43 is reduced by the number equivalent to the process for bending the terminal 43a accordingly, resulting in a low cost. Further, since the terminal 43a of the strobe capacitor 43 is fixed at its base on the laminated board 60, inclination of the strobe capacitor 43 caused by a bend of the terminal 43a can be improved.

FIGS. 21(a) and 21(b) is a diagram showing another embodiment for arranging a neon tube on a laminated board. In an embodiment shown in FIG. 21(a), end portion 60f of the laminated board 60 is bent to be perpendicular to the laminated board 60, and each of lead wires 95a of neon tube 95 is inserted fully in each of mounting holes 60f1 on the end portion 60f to be fixed by solder 80 for continuity. In an embodiment shown in FIG. 21(b), end portion 60f of the laminated board 60 is bent twice to be extended to the position where the neon tube 95 is arranged, namely to the position of a window to confirm strobe charging, and each of lead wires 95a of the neon tube 95 is inserted fully in each of mounting holes 60f1 on the end portion 60f to be fixed by solder 80 for continuity, which makes inclination of the neon tube 95 less than that in the conventional one because the neon tube 95 is fixed on the board at the base of the lead wire 95a.

FIGS. 22(a) to 22(c) is a diagram showing a strobe unit in which a print resistor is provided. In the embodiment shown in FIG. 22(a), a pair of apertures 62b are formed at a prescribed interval on a part of insulating thin plate 60b on one side of laminated board 60 so that a part of metallic thin plate 60a may be exposed at two locations to form two exposed portions 61b of the metallic thin plate 60a to which print resistor 63 is connected electrically. The print resistor 63 is structured by carbon resistor.

In the embodiment shown in FIG. 22(b), big aperture 62b is formed at one location on a part of insulating thin plate 60b on one side of laminated board 60 so that a part of metallic thin plate 60a may be exposed at two locations, and these two exposed portions 61b are connected electrically to print resistor 63.

In the embodiment shown in FIG. 22(c), big aperture 62b is formed at one location on a part of insulating thin plate 60b respectively on both sides of laminated board 60 so that a part of metallic thin plate 60a may be exposed at two locations on both sides, and these two exposed portions 61b are connected electrically to print resistors 63 from both sides.

Since the print resistor 63 is solidly arranged on the laminated board 60 as stated above, the space for arrangement of the laminated board 60 can be secured easily. Further, the print resistor 63 can be arranged either on one side of the laminated board 60 or on any position on both sides, which provides the degree of freedom.

Next, improvements in structure of the laminated board will be explained. FIGS. 23 and 24 show a strobe unit wherein a laminated board is equipped with a strobe capacitor, a luminescence portion, and a neon tube, and FIG. 23 is a perspective view of, while FIG. 24 is a side view of the strobe unit. In the strobe unit 40 in the embodiment, portion 60c on the end of laminated board 60 is bent at right angles. The laminated board 60 is a board wherein both sides of a metallic thin plate having thereon a punched circuit pattern are covered and fixed with insulating thin plates, having problems that stiffness is low and flatness is poor, due to its structure. However, the stiffness and flatness can be improved by bending the portion 60c on the end of the laminated board 60 at right angles.

On the laminated board 60, there are solidly formed battery contact blades 91 and 92 which are made of a metallic thin plate, and further, luminescence portion 50 and strobe switch 93 are connected to the laminated board 60. In addition, end portion 60d of the laminated board 60 is bent, and terminal 43a of strobe capacitor 43 is inserted in the bent end portion 60d to be fixed thereto with solder 65 for continuity. Thus, the terminal 43a of strobe capacitor 43 can easily be fixed to the laminated board 60 for continuity without being bent. The terminal 43a of the strobe capacitor 43 can easily be fixed for continuity on the laminated board 60 without being bent, and the number of processes for the strobe capacitor 43 is reduced by the number equivalent to the process for bending the terminal 43a accordingly, resulting in a low cost.

On the laminated board 60, its end portion 60e is extended to the position where prescribed neon tube 94 is located to be bent, and neon tube 94 that tells about completion of strobe charging is arranged on the bent end portion 60d. The laminated board 60 is a board wherein both sides of a metallic thin plate having thereon a punched circuit pattern are covered and fixed with insulating thin plates, and it is thinner than a paper phenol board and can be bent. Therefore, neon tube 94 is mounted on the laminated board so that the neon tube 94 may be fixed at the base of its lead wire. Further, the laminated board 60 can be extended to be arranged, by being bent, to the position where the neon tube 94 is arranged, thus, the degree of freedom for arrangement of neon tube 94 can be raised.

In an embodiment shown in FIGS. 25(a) to 25(c), a part of metallic thin plate 60a of laminated board 60 is subjected to drawing as shown in FIG. 25(a) and FIG. 25(b) which is a sectional view taken on line I—I in FIG. 25(a), and drawn portion 61f is provided with opening 62f in insulating thin plate 60b to be exposed. This drawn portion 61f may also be covered with insulating thin plate 60b. By giving drawing to a part of metallic thin plate 60a as stated above, it is possible to effectively improve the strength of laminated board 60 with s simple structure.

In an embodiment shown in FIG. 26(a), and an end portion of laminated board 60 is cut off to form cut-out recess 60h on portion 61g where high voltage is impressed on metallic thin plate 60a. In this way, the cut-out recess 60h can make the portion 61g where high voltage is impressed on the metallic thin plate 60a to be the location that is inaccessible to an operator, and it is possible to prevent that an operator is struck by electricity when the laminated board 60 is inspected while it is mounted.

In an embodiment shown in FIG. 26(b), portion 62g of insulating thin plate 60b at the end portion of laminated board 60 is extended so that the portion 62g of the metallic thin plate 60a covers an end face of the portion 61g where high voltage is impressed on the metallic thin plate 60a. Because of the structure wherein the portion 61g of the metallic thin plate 60a of laminated board 60 where high voltage is impressed is covered by portion 62g of insulating thin plate 60b, and it is not touched by an operator accordingly, it is possible to prevent that an operator is struck by electricity when the laminated board 60 is inspected while it is mounted.

Next, the structure to incorporate a laminated board in a film unit will be explained.

First, a laminated board which is able to make a lens-fitted film unit to be thinner and smaller. FIGS. 27(a) and 27(b) are diagrams illustrating this laminated board, and FIG. 27(a) is a front view of a strobe unit, and FIG. 27(b) is an enlarged section taken on line E—E including the lens-fitted film unit in FIG. 27(a).

In FIGS. 27(a) and 27(b), there is shown a strobe unit wherein strobe circuit parts 54 are arranged on both sides of laminated board 60 as illustrated, and an in-between portion of the laminated board 60 on both sides of which the strobe circuit parts are arranged is constituted with only metallic thin plate 60a.

Due to the structure of the laminated board stated above, an extremely narrow gap which allows metallic thin plate 60a to enter has only to be provided between the front side of unit main body 11 forming film roll chamber 16 and front cover 12, and it is possible to make the gap to be further smaller than that in the occasion explained in FIG. 5 stated before by the thickness equivalent to two sheets of insulating thin plate, making the lens-fitted film unit to be further thinner and smaller.

FIG. 28 is a diagram showing how a strobe unit is mounted on a lens-fitted film unit. In a lens-fitted film unit having a strobe function in this embodiment, a pair of protrusions 232a are solidly formed on film chamber 232 of camera main body 230. On laminated board 260 of strobe unit 240, there are arranged strobe capacitor 243, battery contact blade of battery, luminescence portion 250, neon tube 251, strobe switch 252 and strobe luminescence trigger switch 270. On this laminated board 260, there are formed a pair of positioning reference holes 271 for assembly. The laminated board 260 is incorporated when the positioning reference holes 271 for assembly are engaged with the protrusions 232a on film chamber 232 for positioning, and then front cover 202 is engaged with camera main body 230.

Each of FIGS. 29 and 30(a) and 30(b) represents a diagram showing another example of how to mount a strobe unit, and FIG. 29 represents exploded perspective views of a camera main body, a front cover and a strobe unit, while FIGS. 30(a) and 30(b) are diagrams showing how a strobe unit is mounted on a camera main body. In this embodiment, strobe unit 240 is provided with laminated board 260, and strobe capacitor 243, electronic parts 270, luminescence portion 250 and strobe switch 252 are connected to the laminated board 260. Trigger switch 253 is attached on camera main body 230 to be located between lens barrel portion 290 having thereon lens and shutter blade and film chamber 232. The trigger switch 253 has thereon terminal 253a and switch contact blade 253b. An operation of the shutter blade 39 makes the switch contact blade 253b to be closed to cause a strobe to emit light for photographing.

On the laminated board 260, there are formed two (-)-shaped holes 263 as shown in the embodiment in FIG. 17. When mounting the laminated board 260 on the camera main body 230, terminals 120a of the trigger switch 120 are forced into these (-)-shaped holes 263 to be fixed for continuity, and then the front cover 202 is mounted on the camera main body 230. The trigger switch 253 is fixed on the camera main body 230 in the manner mentioned above, thus, the positional accuracy of the trigger switch 253 is improved, its positional relation with a shutter mechanism is made constant, and shutter speed is stabilized.

In an embodiment shown in FIG. 31, there is formed positioning reference hole 61*i* for assembly on a portion of metallic thin plate 61 of laminated board 60. By forming the positioning reference hole 61*i* for assembly on a portion of metallic thin plate 61, the strength of the positioning reference hole 61*i* for assembly of the laminated board 60 is improved, and it prevents that the positioning reference hole is easily deformed or damaged in the course of assembly. Further no positional slip is caused in the state of mounting the laminated board 60, which prevents erroneous operation of the strobe.

In an embodiment shown in FIGS. 32(*a*) to 32(*d*), on at least one location on an area of laminated board 60 formed by only insulating thin plate 62, there is provided engagement portion 62*j* in a shape of a hole (FIG. 32(*a*)), or a cut line or perforations (FIG. 32(*b*)), or a combination of the two above (FIGS. 32(*c*) and 32(*d*)) so that protrusion 32*j* formed on the camera main body is forced in the engagement portion 62*j*. Owing to this, strobe unit 40 can easily be mounted on or dismounted from the camera main body to be inspected, and that, the laminated board 60 can be firmly supported on the camera side through friction without using a specific member newly, thus, a shock caused by falling and others can be absorbed, and damage of electronic parts can be prevented accordingly.

On the tip of the protrusion 32*j*, there is formed taper 32*j*1, and when D3 represents a diameter of engagement portion 62*j* (FIGS. 32(*a*), (*c*) and (*d*)), D4 represents a diameter of the protrusion 32*j*, and D5 represents a diameter of the tip of the taper 32*j*1, the relation of D4>D3>D5 is made to be satisfied. Thus, when the protrusion 32*j* forces the engagement portion 62*j* (FIG. 32(*b*)) open, no special material is needed, and it can easily be supported softly to the extent that damage of electronic parts may be protected from a shock of falling through absorption.

FIGS. 33(*a*) to 33(*e*) are diagrams showing a strobe unit having therein a laminated board in another embodiment. In the embodiment, holes 80 can be formed on area 62*m* of the laminated board 60 formed by only insulating thin plate 62 as shown in FIGS. 33(*a*) and 33(*b*), and information can be recorded depending on the number of holes 80, and then, hole 80 is added as shown with 2-dot chain lines. After a lens-fitted film unit is used, it is disassembled in a photo-finishing laboratory for film processing, and prints are handed to a user. Even when the disassembled lens-fitted film unit is assembled by loading a film to be used again, the number of holes 80 is detected through reflectance of a photosensor or through transmitted light, or the number of holes 80 is detected by a physical and mechanical touch-sensor. Thus, it is possible to easily learn, from the number of holes 80, how many times the strobe unit was used, which prevents that strobe unit 40 with lowered efficiency is used again by mistake.

When the number of holes 80 is detected through reflectance for light, it is possible to enhance the detection efficiency by making the area 62*m* of the laminated board 60 formed by only insulating thin plate 62 to be of a material or a color having high reflectance, or by making a portion on the camera main body 30 to be of a material having low reflectance.

Hole 80 formed on the area 62*m* of the laminated board 60 formed by only insulating thin plate 62 is formed in a form of a complete punched hole in FIG. 33(*c*), an imperfect punched hole in FIG. 33(*d*), or a piercing hole in FIG. 33(*e*). Owing to the hole 80 formed on the area 62*m* formed by only insulating thin plate 62, reading by means of a photosensor is easy, which makes it possible not only to detect automatically but also to recognize visually and easily. Moreover, it is possible to record information without requiring a specific and expensive equipment such as a marker, and to effectively prevent altering.

Next, the structure of a combination of a paper phenol board and a laminated board will be explained.

FIG. 34 is a front view of a strobe unit, FIG. 35 is a bottom view of the strobe unit, FIG. 36 is a rear view of the strobe unit, and FIG. 37 is a side view of a luminescence section and a battery contact blade.

Circuit board 341 of strobe unit 340 is connected with paper phenol board 360 and with laminated board 361 to be a solid board. The paper phenol board 360 has printed circuit pattern 362, and the laminated board 361 is formed to be thin in a manner that metallic thin plate 363 on which a circuit pattern is punched is fixed to be covered from both sides with insulating thin plate 364.

The paper phenol board 360 is provided on its side for parts with electronic part 370 and trigger switch 372, and further, strobe capacitor 343 is connected to the paper phenol board 360. On the laminated board 361, there are solidly formed metal sheet parts such as battery contact blades 380 and 81, xenon tube terminals 382 and 383, and main switch 384. The laminated board 361 is of structure wherein metallic thin plate 363 on which a circuit pattern is punched is fixed to be covered from its both sides with insulating thin plates 364, and it is therefore difficult to mount electronic part 370 and trigger switch 372 with a machine and to solder them collectively in a soldering tank. Therefore, electronic part 370 and trigger switch 372 are arranged on paper phenol board 360, while metal sheet parts such as battery contact blades 380 and 381, xenon tube terminals 382 and 383, and main switch 384 are solidly formed on laminated board 361, thus, man-hour for assembly and the number of parts are reduced and cost reduction can be achieved.

Paper phenol board 360 is arranged between lens barrel portion having thereon photographing lens and shutter blade and film chamber as shown in FIG. 2. Laminated board 361 is arranged from the front portion of the film chamber to the front portion of battery chamber. By arranging the paper phenol board 360 between the lens barrel portion having relatively a space for arrangement and the film chamber, it is possible to make lens-fitted film unit 1 thinner. By arranging the thin laminated board 361 from the front portion of the film chamber to the front portion of the battery chamber, it is possible to make a clearance between the film chamber and front cover smaller and thereby to make a lens-fitted film unit thinner.

Figure 38:
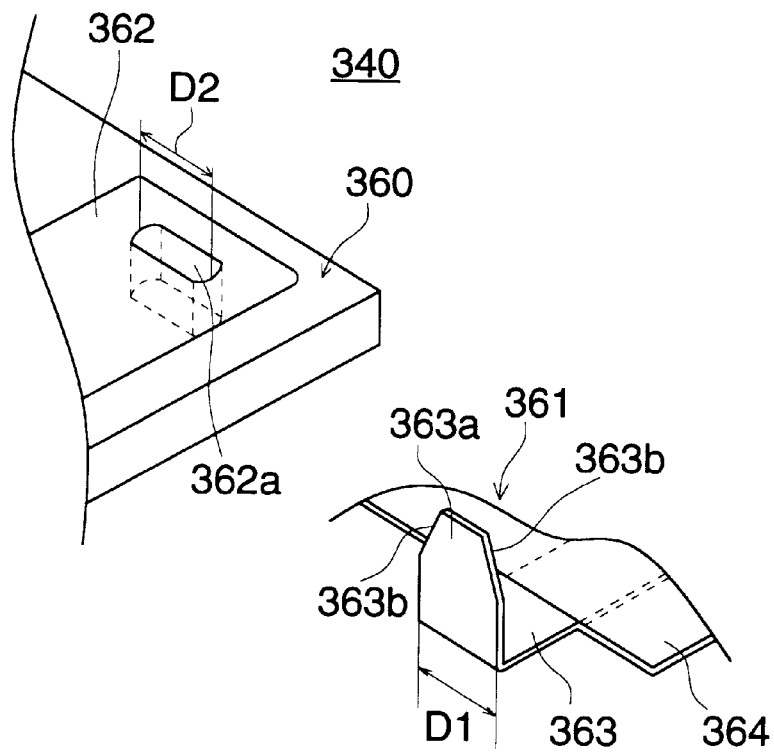
Figure 38:
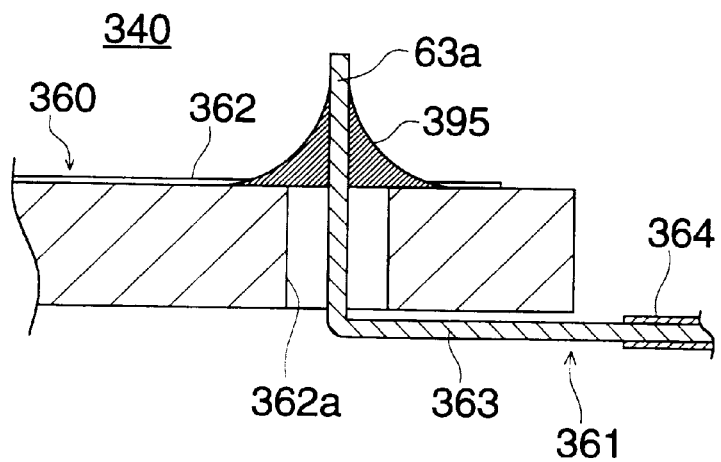
Figure 39:
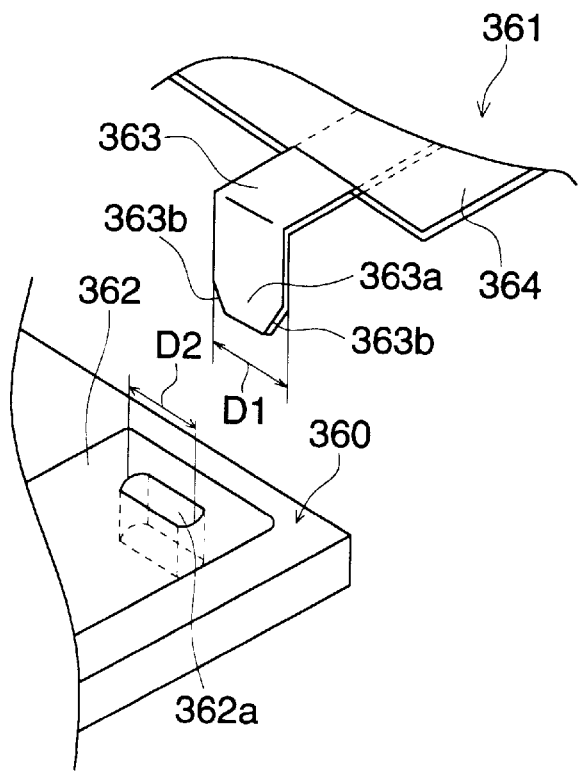
Figure 39:
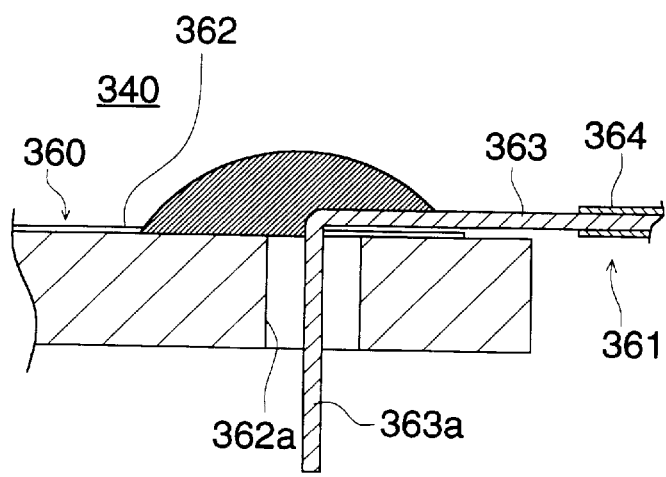

Next, connection between the paper phenol board 360 and the laminated board 361 will be explained based on FIGS. 38(*a*) and 38(*b*) and FIGS. 39(*a*) and 39(*b*). FIGS. 38(*a*) and 38(*b*) are diagrams showing an embodiment wherein the laminated board is connected from the surface for parts of the paper phenol board, and FIGS. 39(*a*) and 39(*b*) are diagrams showing an embodiment wherein the laminated board is connected from the surface for a pattern of the paper phenol board.

Lens-fitted film unit 1 has therein strobe unit 340 wherein a part of a board is structured with laminated board 361 and the other part thereof is structured with paper phenol board 360, and in an embodiment in FIGS. 38(*a*) and 38(*b*), hole 360*a* is formed at the location of printed circuit pattern 362 formed on the paper phenol board 360. On the other hand, a part of the laminated board 361, namely connection blade portion 363*a* of metallic thin plate 363 on which a circuit pattern is punched is bent at right angles, and both ends of the bent portion are filed off to form inclinations 363b. The connection blade portion 363a the laminated board 361, is structured to be capable of being forced in by making its width D1 to be slightly greater than width D2 of hole 360a of the paper phenol board 360. The connection blade portion 363a of the laminated board 361 is inserted into hole 362a on the paper phenol board 360 from the surface for parts to be protruded, then, it is soldered with solder 395 to be fixed, and it is electrically connected with circuit pattern 362 to be a united board.

In an embodiment in FIGS. 39(a) and 39(b), the structure thereof is the same as that of the embodiment in FIGS. 38(a) and 38(b), but a part of the laminated board 361, namely connection blade portion 363a of metallic thin plate 363 on which a circuit pattern is punched is bent at right angles in the opposite direction, and this connection blade portion 363a is inserted into hole 362a on the paper phenol board 360 from the surface for the pattern, then, it is soldered with solder 395 to be fixed, and it is electrically connected with circuit pattern 362 to be a united board.

When a part of the laminated board 361 is inserted into the hole 362a on the paper phenol board 360 to be soldered as stated above, positional dispersion between both boards is eliminated, and solder peeling caused by force applied and pattern peeling of the paper phenol board 360 tend not to occur, when compared with an occasion wherein both boards are combined by only soldering. When the laminated board 361 is forced in the hole 362a of the paper phenol board 360, it is prevented that the laminated board accidentally comes off the hole before it is soldered.

Each of FIG. 40 and FIGS. 41(a) and 41(b) represents a diagram showing another example of connection between a paper phenol board and a laminated board, and FIG. 40 represents exploded perspective views for a camera main body, a front cover and a strobe unit, while FIGS. 41(a) and 41(b) are diagrams showing how the strobe unit is mounted on the camera main body. In this embodiment, circuit board 441 of the strobe unit 440 is connected with both paper phenol board 480 and laminated board 460 to be a united board. To the paper phenol board 480, there are connected electronic part 470 and strobe switch 475, and to the laminated board 460, there are connected luminescence portion 450 and strobe switch 475.

On the paper phenol board 480, there are formed a pair of connection holes 480a. On the paper phenol board 480, there is formed a circuit pattern 481 which is extended to the connection hole 480a and its surrounding. On metallic thin plate 460a of the laminated board 460, there are formed a pair of connection portions 460a6 which are protruded to the side, and connection holes 460d are formed on the connection portions 468a6.

On film chamber 432 of camera main body 430, on the other hand, there are formed a pair of bosses 430b solidly with the side of the film chamber where strobe unit 440 is to be mounted. These bosses 430b are engaged with recesses 402a of front cover 402 for mounting the front cover, representing that the paired bosses 430b serve as members for fixing the front cover 402 on the camera main body 430.

Connection holes 480a of paper phenol board 480 are engaged with a pair of bosses 430b on camera main body 430 as shown in FIG. 41(b), then, connection holes 460d of laminated board 460 are also engaged with the bosses to be superposed on the paper phenol board, and recesses 402a of the front cover 402 are further engaged with the bosses. While the condition explained above is kept, connection portions 460a6 on metallic thin plate 460a of the laminated board 460 are superposed on circuit pattern 481 of the paper phenol board 480 to be fixed for continuity. Fixing of the front cover 402 on the camera main body 430 in the above-mentioned manner makes it possible for both the paper phenol board 480 and the laminated board 460 to be connected, and it also makes connection of both boards, soldering work, and additional and special connecting member to be unnecessary, to achieve simple and sure fixing for continuity.

What is claimed is:

1. A lens-fitted film unit with a built-in strobe, comprising a unit main body, in which a photographing member for conducting photographing is incorporated, a strobe circuit, a cover member to cover the unit main body and the strobe circuit;

the strobe circuit comprising a metallic thin plate punched in a circuit pattern, insulating plates covering both obverse and reverse surfaces of the metallic thin plate, and wherein a part of the metallic thin plate is used as a component of the strobe circuit and the metallic thin plate is 0.07–0.2 mm in thickness and the insulating plates are 0.05–0.19 mm in thickness.

2. A lens-fitted film unit with a built-in strobe, comprising a unit main body, in which a photographing member for conducting photographing is incorporated, a strobe circuit, a cover member to cover the unit main body and the strobe circuit;

the strobe circuit comprising a metallic thin plate punched in a circuit pattern, insulating plates covering both obverse and reverse surfaces of the metallic thin plate, and wherein a part of the metallic thin plate is used as a component of the strobe circuit, said part of the metallic thin plate being bent perpendicularly to the strobe circuit and is used as a switching contact, said switching contact comprising an actuating contact, movable in a direction toward and away from a fixed contact on said strobe circuit in a direction parallel to said strobe circuit.

3. The lens-fitted unit of claim 2 wherein said switching contact and said fixed contact face each other.

4. A lens-fitted film unit with a built-in strobe, comprising a unit main body, in which a photographing member for conducting photographing is incorporated, a strobe circuit, a cover member to cover the unit main body and the strobe circuit;

the strobe circuit comprising a metallic thin plate punched in a circuit pattern, insulating plates covering both obverse and reverse surfaces of the metallic thin plate, and wherein a part of the metallic thin plate is used as a component of the strobe circuit, the part of the metallic thin plate is bent perpendicularly to the strobe circuit and being used as a contact piece for a battery.

* * * * *